United States Patent
Ogawa et al.

(10) Patent No.: US 9,589,657 B2
(45) Date of Patent: Mar. 7, 2017

(54) INTERNAL POWER SUPPLY VOLTAGE AUXILIARY CIRCUIT, SEMICONDUCTOR MEMORY DEVICE AND SEMICONDUCTOR DEVICE

(71) Applicant: Powerchip Technology Corporation, Hsinchu (TW)

(72) Inventors: Akira Ogawa, Tokyo (JP); Nobuhiko Ito, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 26 days.

(21) Appl. No.: 14/723,470

(22) Filed: May 28, 2015

(65) Prior Publication Data

US 2016/0155512 A1 Jun. 2, 2016

(30) Foreign Application Priority Data

Nov. 28, 2014 (JP) ................................ 2014-241904

(51) Int. Cl.
  *G11C 5/14* (2006.01)
  *G11C 16/30* (2006.01)
  *G11C 7/10* (2006.01)

(52) U.S. Cl.
  CPC ............... *G11C 16/30* (2013.01); *G11C 5/14* (2013.01); *G11C 7/106* (2013.01); *G11C 7/1039* (2013.01); *G11C 7/1066* (2013.01)

(58) Field of Classification Search
  CPC ......... G11C 16/30; G11C 5/14; G11C 7/1039; G11C 7/106

(Continued)

(56) References Cited

U.S. PATENT DOCUMENTS

| 5,646,902 A | * | 7/1997 | Park .................. | G11C 5/143 365/195 |
| 5,689,460 A | * | 11/1997 | Ooishi ................ | G11C 5/143 327/530 |

(Continued)

FOREIGN PATENT DOCUMENTS

| JP | H08-190437 | 7/1996 |
| JP | 2003142999 | 5/2003 |

(Continued)

OTHER PUBLICATIONS

"Office Action of Japanese Counterpart Application", issued on Oct. 20, 2015, p. 1-p. 4, in which the listed reference was cited.

*Primary Examiner* — Viet Q Nguyen
(74) *Attorney, Agent, or Firm* — Jianq Chyun IP Office

(57) ABSTRACT

The disclosure provides an internal power supply voltage auxiliary circuit for an internal power supply voltage generating circuit, wherein the internal power supply voltage generating circuit includes: a differential amplifier, comparing an internal power voltage supplied to a loading circuit with a predetermined reference voltage, and outputting a control voltage from an output terminal; and a driving transistor, driving an external power voltage according to the control voltage. The internal power supply voltage auxiliary circuit includes: a time sequence detecting circuit, detecting a transition of a data signal, generating and outputting a detecting signal; and an internal power voltage auxiliary supplying circuit, auxiliary supplying a current for the loading circuit based on the detecting signal. Therefore, it is possible to output an internal power voltage stably, while power consumption would not increase greatly, even when being used in the semiconductor memory device with the DDR.

38 Claims, 28 Drawing Sheets

(58) Field of Classification Search
USPC .......................................... 365/226, 227, 228
See application file for complete search history.

(56) References Cited

U.S. PATENT DOCUMENTS

| | | | | |
|---|---|---|---|---|
| 5,859,799 A | * | 1/1999 | Matsumoto | G11C 5/14 365/189.09 |
| 5,905,688 A | * | 5/1999 | Park | G11C 29/50 365/226 |
| 6,067,256 A | * | 5/2000 | Yamashita | G11C 11/419 365/189.04 |
| 2002/0024837 A1 | * | 2/2002 | Iwanari | G11C 11/22 365/145 |
| 2004/0199803 A1 | | 10/2004 | Suzuki et al. | |
| 2007/0035973 A1 | * | 2/2007 | Kitazaki | H02M 3/073 363/59 |
| 2010/0052743 A1 | * | 3/2010 | Kamizuma | G06F 13/4243 327/144 |
| 2014/0176189 A1 | * | 6/2014 | Wang | H03K 3/0375 326/81 |
| 2016/0055831 A1 | * | 2/2016 | Kim | G09G 3/3283 345/212 |

FOREIGN PATENT DOCUMENTS

| | | |
|---|---|---|
| JP | 2006268656 | 10/2006 |
| JP | 2009157728 | 7/2009 |
| JP | 2014010877 | 1/2014 |

* cited by examiner

INTERNAL POWER SUPPLY VOLTAGE AUXILIARY CIRCUIT, SEMICONDUCTOR MEMORY DEVICE AND SEMICONDUCTOR DEVICE

CROSS-REFERENCE TO RELATED APPLICATION

This application claims the priority benefit of Japan application serial no. 2014-241904, filed on Nov. 28, 2014. The entirety of the above-mentioned patent application is hereby incorporated by reference herein and made a part of this specification.

BACKGROUND OF THE INVENTION

Field of the Invention

The invention relates to an internal power supply voltage auxiliary circuit for supplying or consuming an electronic charge of an auxiliary power voltage for an internal power supply voltage generating circuit, and a semiconductor memory device and a semiconductor device having the internal power supply voltage auxiliary circuit. The internal power supply voltage generating circuit is used for generating an internal power voltage VDD in the semiconductor memory device or the semiconductor device. Further, in the invention, the internal power supply voltage auxiliary circuit includes an internal power supply voltage auxiliary supplying circuit and an internal power supply voltage auxiliary consuming circuit. The internal power voltage auxiliary supplying circuit supplies the electrical charge of the auxiliary power voltage. The internal power voltage auxiliary consuming circuit consumes the electrical charge of the auxiliary power voltage. The internal power supply voltage auxiliary circuit may also be any one of the internal power voltage auxiliary supplying circuit and the internal power voltage auxiliary consuming circuit.

Description of Related Art

In order to perform data writing (programming) or data erasing on a non-volatile memory device (e.g., a flash memory) that adopts use of the Fowler-Nordheim (FN), a predetermined high voltage (HV) is required. However, due to poor efficiency problem of a charge pump circuit, it is quite difficult to lower an external power voltage VCC. Therefore, the internal power voltage VDD is further generated by the external power voltage VCC and used in peripheral circuits of the memory device. In this case, the internal power voltage VDD must be adjusted to fall within a suitable operating voltage range of Metal-Oxide-Semiconductor (MOS) transistors in the peripheral circuits. For example, the internal power voltage VDD of 2 V to 2.3 V is usually generated in a NAND type flash memory (e.g., referring to Patent Document 1).

PRIOR ART DOCUMENT

Patent Document

Patent Document 1: Japanese Patent Publication No. 2014-010877
Patent Document 2: Japanese Patent Publication No. 2006-268656
Patent Document 3: Japanese Patent Publication No. 2009-157728
Patent Document 4: US Patent Application Publication No. 2004/199803

SUMMARY OF THE INVENTION

Problems to be Solved by the Invention

Generally, a reading mode of the NAND type flash memory adopts use of a single data rate (SDR). However, a flash memory which performs reading by using a double data rate (DDR) has been introduced and expected to grow more popular in the future market. Although a performance for reading is sufficient even if the conventional NAND type flash memory using the SDR operates simply by using the internal power voltage VDD generated by the conventional internal power supply voltage generating circuit, in the case of the NAND type flash memory using the DDR, it is considered that the data reading may not be performed by the following reason.

For example, the internal power supply voltage generating circuit of the existing technology may operate sufficiently in a SDR type flash memory but may operate insufficiently in a DDR type flash memory. For example, a reading cycle of the SDR flash memory is 25 ns, but a reading cycle of the DDR type flash memory is less than 10 ns.

That is to say, due to the high speed data rate, a swing of a load current iVDD during a DDR operation becomes significantly large as compared to the same in a SDR operation. In other words, when the load current iVDD flow, the internal power voltage VDD is dropped significantly while a restoration of a voltage level becomes slower. In this case, for example, when a variation occurs on the load current iVDD within a short period of time, it is expected that the internal power supply voltage generating circuit is incapable of operating in the manner of maintaining the internal power voltage VDD.

For example, Patent Document 2 discloses: a clock frequency of a delay-locked loop (DLL) circuit, wherein an additional internal voltage is applied when the clock frequency is higher than a predetermined value. Further, Patent Document 3 discloses: an additional internal power circuit being provided, wherein when the internal power voltage stepped down an external power voltage is supplied to a target circuit, in order to obtain a favorable power property in either case of starting or ending the operation of the target circuit, the additional internal power circuit is capable of performing an over drive during a standby of an active transport. Furthermore, Patent Document 3 also discloses that the internal power voltage may be changed based on a clock frequency and an operation mode.

In a simple method for improving an operating speed, if a drivability of a differential amplifier for controlling a driving transistor used for generating the internal power voltage VDD may be enhanced, a responding speed is increased accordingly. However, in aforesaid method, a power consumption may be increased greatly, which leads to a risk of oscillation.

The invention aims to solve aforesaid problems by providing an internal power supply voltage auxiliary circuit, which is capable of, for example, performing the data reading with a speed higher than that in the existing technology without greatly increasing the power consumption even when being used in the semiconductor memory device that performs the data reading with the DDR.

Moreover, the invention further aims to provide a semiconductor memory device and a semiconductor device having aforesaid internal power supply voltage auxiliary circuit.

Technical Means for Solving the Problems

An internal power supply voltage auxiliary circuit of the first invention is used for an internal power supply voltage generating circuit. The internal power supply voltage generating circuit including a differential amplifier and a driving transistor. The differential amplifier comparing an internal power voltage supplied to a loading circuit with a predetermined first reference voltage and outputting a control signal indicating a comparison result from an output terminal. The driving transistor driving an external power voltage according to the control signal and outputting the internal power voltage to the loading circuit via an internal power line. The internal power supply voltage generating circuit adjusting the internal power voltage into the first reference voltage. The internal power supply voltage auxiliary circuit further includes: a time sequence detecting circuit, detecting a transition of a data signal, generating and outputting a detecting signal; and an internal power voltage auxiliary supplying circuit, auxiliarily supplying a current for the loading circuit based on the detecting signal.

The internal power supply voltage auxiliary circuit is characterized in that, the internal power voltage auxiliary supplying circuit includes: an auxiliary voltage generating circuit, including a first MOS transistor and a second MOS transistor connected in series between the external power voltage and the internal power line; and a control voltage generating circuit, generating a control voltage for supplying a predetermined current to the internal power line, the first MOS transistor is controlled according to the detecting signal, and the second MOS transistor is controlled based on the control signal to make the predetermined current flow.

Further, the internal power supply voltage auxiliary circuit is characterized in that, the auxiliary voltage generating circuit further includes: a charging capacitor, inserted between the first MOS transistor and the second MOS transistor, and charging an electrical charge of the current.

Furthermore, the internal power supply voltage auxiliary circuit is characterized in that, the control voltage generating circuit generates the control voltage according to a current corresponding to the predetermined current that flow based on the internal power voltage, and the current isflowing based on the external power voltage.

The internal power supply voltage auxiliary circuit is characterized in that, the control voltage generating circuit includes: a regulator control voltage generating circuit, making a current flow to a third MOS transistor and a resistor connected in series to each other between the external power voltage and a ground voltage in order to generate a control voltage as the control voltage for outputting, and the control voltage being applied to a gate of the third MOS transistor so that a voltage at a connection point between the third MOS transistor and the resistor becomes a predetermined second reference voltage.

Herein, the internal power supply voltage auxiliary circuit is characterized in that, the second reference voltage is identical to the first reference voltage.

In addition, the internal power supply voltage auxiliary circuit is characterized in that, the second reference voltage is lower than or higher than the first reference voltage.

The internal power supply voltage auxiliary circuit is characterized in that, the control voltage generating circuit generates and outputs the control voltage, where the control voltage is applied to a gate of the second MOS transistor so that the internal power voltage of the internal power line becomes a predetermined second reference voltage.

Herein, the internal power supply voltage auxiliary circuit is characterized in that, the second reference voltage is identical to the first reference voltage.

In addition, the internal power supply voltage auxiliary circuit is characterized in that, the second reference voltage is lower than or higher than the first reference voltage.

The internal power supply voltage auxiliary circuit is characterized in that, the internal power voltage auxiliary supplying circuit includes: an auxiliary voltage generating circuit, including a resistor and a MOS transistor connected in series between the external power voltage and the internal power line, and the MOS transistor is controlled according to the detecting signal.

Further, the internal power supply voltage auxiliary circuit is characterized in that, the internal power voltage auxiliary supplying circuit further includes: an auxiliary voltage generating circuit, including a MOS transistor connected between the external power voltage and the internal power line, and the MOS transistor is controlled according to the detecting signal.

The internal power supply voltage auxiliary circuit is characterized in that, the time sequence detecting circuit detects transitions of multi-bit data signals, generates and outputs corresponding multi-bit detecting signals, the internal power voltage auxiliary supplying circuit provides a plurality of the auxiliary voltage generating circuits connected in parallel and having an amount identical to an amount of the detecting signals.

In addition, the internal power supply voltage auxiliary circuit is characterized in that, the time sequence detecting circuit detects variations of multi-bit data signals, generates and outputs corresponding multi-bit detecting signals. The internal power supply voltage auxiliary circuit further includes: a data migration counting circuit, generating a detecting signal based on the multi-bit detecting signals, and outputting the migrated detecting signals to the internal power voltage auxiliary supplying circuit, and the migrated detecting signals having pulses width corresponding to a number of bits having a predetermined level in the multi-bit detecting signal.

Furthermore, the internal power supply voltage auxiliary circuit is characterized in that, the time sequence detecting circuit detects transitions of multi-bit data signals, generates and outputs corresponding multi-bit detecting signals, the internal power voltage auxiliary supplying circuit provides a plurality of the auxiliary voltage generating circuits connected in parallel and having an amount identical to an amount of the multi-bit detecting signals. The internal power supply voltage auxiliary circuit further includes: a comparison circuit, comparing the internal power voltage with a predetermined third reference voltage to generate a comparison result signal, and generating a plurality of different detecting signals based on the comparison result signal and the multi-bit detecting signals, and outputting the different detecting signals to the auxiliary voltage generating circuits.

Herein, the internal power supply voltage auxiliary circuit is characterized in that, the third reference voltage is identical to the first reference voltage.

In addition, the internal power supply voltage auxiliary circuit is characterized in that, the third reference voltage is lower than or higher than the first reference voltage.

The internal power supply voltage auxiliary circuit is characterized in that, the time sequence detecting circuit detects transitions of multi-bit data signals, generates and outputs corresponding multi-bit detecting signals, and the internal power voltage auxiliary supplying circuit provides a plurality of the auxiliary voltage generating circuits connected in parallel and having an amount identical to an amount of the multi-bit detecting signals. The internal power supply voltage auxiliary circuit further includes: a comparison circuit, comparing the internal power voltage with the predetermined third reference voltage to generate a first comparison result signal, comparing the internal power voltage with a fourth reference voltage different from the third reference voltage to generate a second comparison result signal, and generating a plurality of different detecting signals based on the first comparison result signal, the second comparison result signal and the multi-bit detecting signals, and outputting the different detecting signals to the auxiliary voltage generating circuits.

In addition, the internal power supply voltage auxiliary circuit is characterized in that, the comparison circuit generates a plurality of different detecting signals based on the first comparison result signal, the second comparison result signal, the multi-bit detecting signals and a predetermined case selecting signal, and outputs the different detecting signals to the auxiliary voltage generating circuits, and the comparison circuit selectively switches, according to the case selecting signal, to compare with the third reference voltage or compare with the fourth reference voltage by drop or rise of the internal power voltage.

Herein, the internal power supply voltage auxiliary circuit is characterized in that, the third reference voltage or the fourth reference voltage is identical to the first reference voltage.

In addition, the internal power supply voltage auxiliary circuit is characterized in that, the third reference voltage is lower than or higher than the first reference voltage.

The internal power supply voltage auxiliary circuit is characterized in that, the internal power supply voltage auxiliary circuit includes: a decoder, decoding a predetermined first multi-bit detecting signal into a decoded detecting signal having a number of bits less than a number of bits in the multi-bit detecting signal; a plurality of auxiliary voltage generating circuits, each including a first MOS transistor and a second MOS transistor connected in series between the external power voltage and the internal power line; and a plurality of control voltage generating circuits, making a current flow to a third MOS transistor and a resistor connected in series to each other between the external power voltage and a ground voltage in order to generate a control voltage applied to a gate of the third MOS transistor and generate the control voltage applied to a gate of the first MOS transistor corresponding to each of the auxiliary voltage generating circuits, and outputting the control voltages respectively so that a voltage at a connection point between the third MOS transistor and the resistor becomes a predetermined second reference voltage, the second MOS transistor of each of the auxiliary voltage generating circuits is controlled according to a corresponding bit of the decoded detecting signal, and the first MOS transistor of each of the auxiliary voltage generating circuits is controlled based on the control voltage from each of the control voltage generating circuits to make a predetermined current flow.

Further, the internal power supply voltage auxiliary circuit is characterized in that, the auxiliary voltage generating circuit further includes: a charging capacitor, inserted between the first MOS transistor and the second MOS transistor, and charging an electrical charge of the current.

Herein, the internal power supply voltage auxiliary circuit is characterized in that, the second reference voltage is identical to the first reference voltage.

In addition, the internal power supply voltage auxiliary circuit is characterized in that, the second reference voltage is lower than or higher than the first reference voltage.

Furthermore, the internal power supply voltage auxiliary circuit is characterized in that, the second reference voltages in the control voltage generating circuits are equal to or different from one another.

Furthermore, the internal power supply voltage auxiliary circuit is characterized in that, resistance values of the resistors in the control voltage generating circuits are equal to or different from one another.

The internal power supply voltage auxiliary circuit is characterized in that, the MOS transistor is a PMOS transistor or a NMOS transistor.

The internal power supply voltage auxiliary circuit is characterized in that, the time sequence detecting circuit detects transitions of multi-bit data signals, generates and outputs corresponding multi-bit detecting signals, the internal power voltage auxiliary supplying circuit includes an auxiliary voltage generating circuit, the auxiliary voltage generating circuit includes a predetermined channel MOS transistor and a first N-channel MOS transistor connected in series between the external power voltage and the internal power line, the internal power voltage auxiliary supplying circuit includes a control voltage generating circuit, and the control voltage generating circuit makes the current flow to a second N-channel MOS transistor and a resistor connected in series to each other based on the external power voltage and outputs an output voltage of the second N-channel MOS transistor as the control voltage, wherein in the internal power voltage auxiliary supplying circuit, the predetermined channel MOS transistor is controlled according to the multi-bit detecting signal, and the first N-channel MOS transistor is based on the control voltage to make a predetermined current flow.

Further, the internal power supply voltage auxiliary circuit is characterized in that, the predetermined channel MOS transistor is a PMOS transistor or a NMOS transistor.

Herein, the internal power supply voltage auxiliary circuit is characterized in that, the internal power voltage is identical to the external power voltage.

In addition, the internal power supply voltage auxiliary circuit is characterized in that, the internal power voltage is lower than or higher than the external power voltage.

An internal power supply voltage auxiliary circuit of the second invention is used for an internal power supply voltage generating circuit. The internal power supply voltage generating circuit including a differential amplifier and a driving transistor. The differential amplifier comparing an internal power voltage supplied to a loading circuit with a predetermined first reference voltage and outputting a control signal indicating a comparison result from an output terminal. The driving transistor driving an external power voltage according to the control voltage and outputting the internal power voltage to the loading circuit via an internal power line. The internal power supply voltage generating circuit adjusting the internal power voltage into the first reference voltage. The internal power supply voltage auxiliary circuit further includes: a time sequence detecting circuit, detecting a case where the current for the loading circuit is reduced according to a data signal, and outputting a detecting signal; and an internal power voltage auxiliary consuming circuit, auxiliary consuming an reduced amount of a current consumption by the loading circuit based on the detecting signal.

The internal power supply voltage auxiliary circuit is characterized in that, the internal power voltage auxiliary consuming circuit includes: an auxiliary voltage consuming circuit, including a first N-channel MOS transistor and a second N-channel MOS transistor connected in series between the internal power line and a ground; and a control voltage generating circuit, generating a control voltage for consuming a predetermined current from the internal power line, wherein the first N-channel MOS transistor is controlled according to the detecting signal, and the second N-channel MOS transistor is controlled based on the control voltage to make the predetermined current flow.

In addition, the internal power supply voltage auxiliary circuit is characterized in that, the time sequence detecting circuit detects transitions of multi-bit data signals, generates and outputs corresponding multi-bit detecting signals. The internal power voltage auxiliary consuming circuit provides a plurality of the auxiliary voltage consuming circuits connected in parallel and having an amount identical to an amount of the detecting signals.

The internal power supply voltage auxiliary circuit is characterized in that, the time sequence detecting circuit includes: a decoder, decoding the detecting signal into a decoded detecting signal having a predetermined number of bits less than a number of bits in the detecting signal, and the internal power voltage auxiliary consuming circuit provides a plurality of the auxiliary voltage consuming circuits connected in parallel and having an amount identical to an amount of the multi-bit decoded detecting signals.

A semiconductor memory device of the third invention includes aforesaid internal power supply voltage auxiliary circuit.

The semiconductor memory device is characterized in that, the semiconductor memory device performs a data writing or a data reading with a speed faster than a clock speed based on a data wiring signal or a data reading signal respectively, and the time sequence detecting circuit makes the internal power supply voltage auxiliary circuit to operate based on the data writing signal or the data reading signal.

Further, the semiconductor memory device is characterized in that, the speed faster than the clock speed is a double speed of the clock speed which is a double data rate (DDR).

A semiconductor device of the fourth invention includes aforesaid internal power supply voltage auxiliary circuit.

Effect of the Invention

The current for the internal power line may be auxiliary supplied by the internal power supply voltage auxiliary circuit according to the invention. Alternatively, the current may be averaged by auxiliary consuming the current from the internal power line so as to stabilize the internal power voltage VDD. As a result, the data reading may be performed with the speed higher than that in the existing technology without greatly increasing the power consumption even when being used in the semiconductor memory device that performs the data reading with the DDR.

DESCRIPTION OF THE EMBODIMENTS

Embodiments of the invention are described in detail below by reference with accompanied drawings. Also, in each of the following embodiments, the same reference numbers are used to refer to the same component elements.

Embodiment 1

Figure 1:
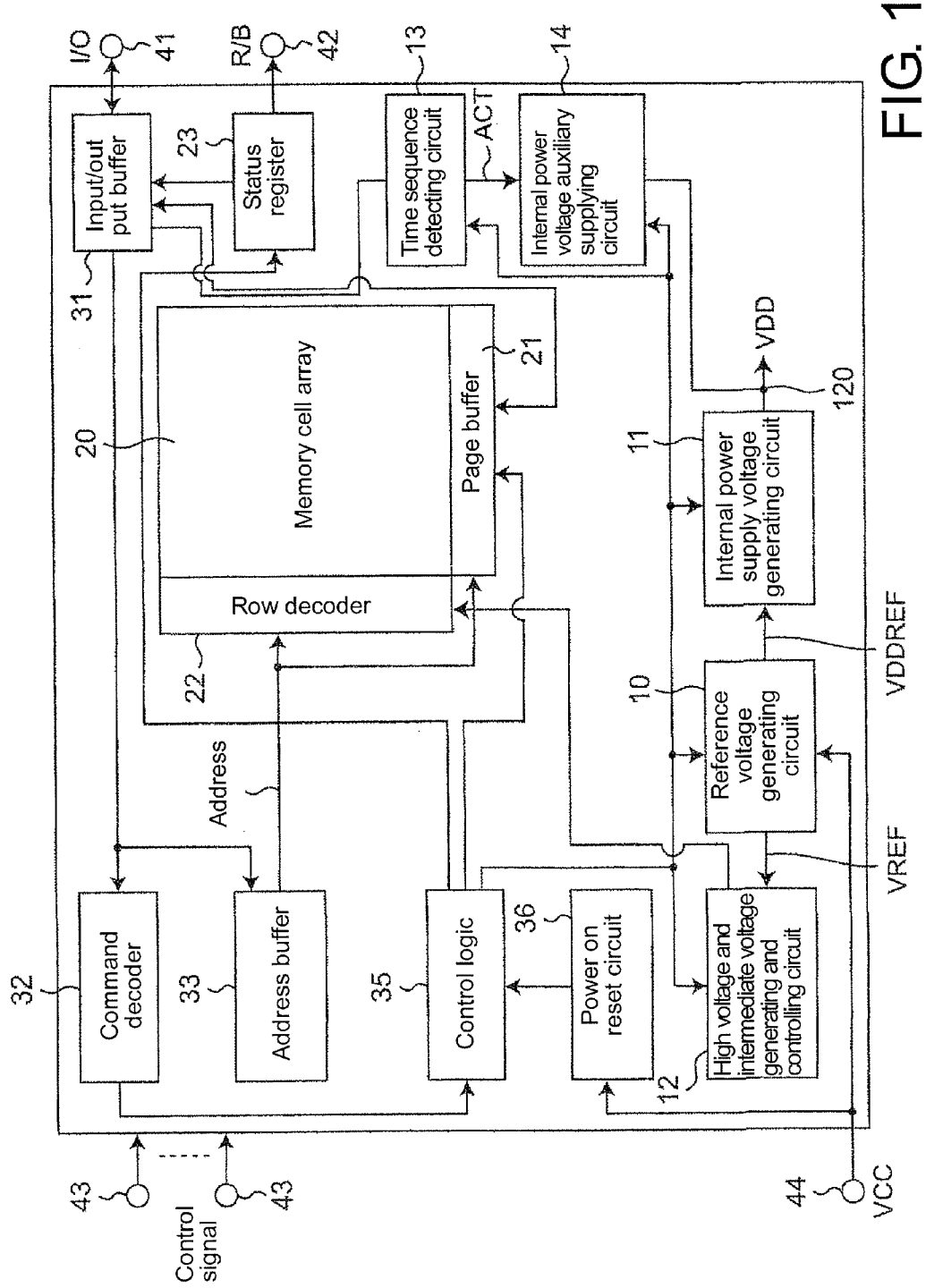
FIG. 1 is a block diagram illustrating a non-volatile memory device according to Embodiment 1 of the invention.

FIG. 1 is a block diagram illustrating a non-volatile memory device according to Embodiment 1 of the invention. The non-volatile memory device in Embodiment 1 is a flash memory, for example, which is characterized in that: in order to generate the internal power voltage VDD capable of operating in high speed even if being use in, for example, the DDR operation, a time sequence detecting circuit 13 and an internal power voltage auxiliary supplying circuit 14 are further provided in addition to an internal power supply voltage generating circuit 11.

In FIG. 1, the non-volatile memory device includes: (1) a memory cell array 20, served as a flash memory array, for example, and configured to store data; (2) a page buffer 21, configured to write data from an input/output buffer 31 in pages into the memory cell array 20, or configured to output data read from the memory cell array in pages to the input/output buffer 31; (3) a row decoder 22, configured to designate a block and a word line of the memory cell array 20 in response to a designated address; (4) a status register 23, temporarily storing a status of the non-volatile memory device based on a signal from a control logic 35 and outputting the status to the input/output buffer 31, and generating and outputting a ready/busy signal (R/B signal) to a R/B signal terminal 42; (5) the input/output buffer 31, temporarily storing data inputted/outputted via an input/output terminal 41; (6) a command decoder 32, for decoding a command from the input/output buffer 31, and outputting decoded command data to the control logic 35; (7) an address buffer 33, temporarily storing the designated address from the input/output buffer 31; (8) a power on reset circuit 36, outputting a reset signal for resetting operations of a semiconductor chip when the power is turned on based on the external power voltage VCC; (9) a reference voltage generating circuit 10, generating a reference voltage VDDREF for a predetermined internal power voltage and a predetermined reference voltage VREF based on the external power voltage VCC applied via an external power voltage terminal 44; (10) the internal power supply voltage generating circuit 11, generating the internal power voltage VDD based on the reference voltage VDDREF, and supplying the internal power voltage VDD to each circuit; (11) a high voltage and intermediate voltage generating and controlling circuit 12, generating and outputting a high voltage (HV) and an intermediate voltage (MV) required in data writing (programming) and erasing operations based on the reference voltage VREF; (12) the control logic 35, performing a predetermined control for each circuit in the non-volatile memory device (including the reference voltage generating circuit 10, the internal power supply voltage generating circuit 11, as well as the high voltage and intermediate voltage generating and controlling circuit 12, the time sequence detecting circuit 13, the internal power voltage auxiliary supplying circuit 14, the page buffer 21 and the status register 23) based on the command data from the command decoder 32, a control signal inputted via a control signal terminal 43, or the reset signal from the power on reset circuit 36; (13) the time sequence detecting circuit 13, detecting a predetermined time sequence based on a data signal in the input/output buffer 31, and generating and outputting an action indicating signal ACT based on the predetermined time sequence; and (14) the internal power voltage auxiliary supplying circuit 14, generating a predetermined auxiliary power voltage based on the action indication signal ACT and supplying the auxiliary power voltage to a line of the internal power voltage VDD.

Figure 2:
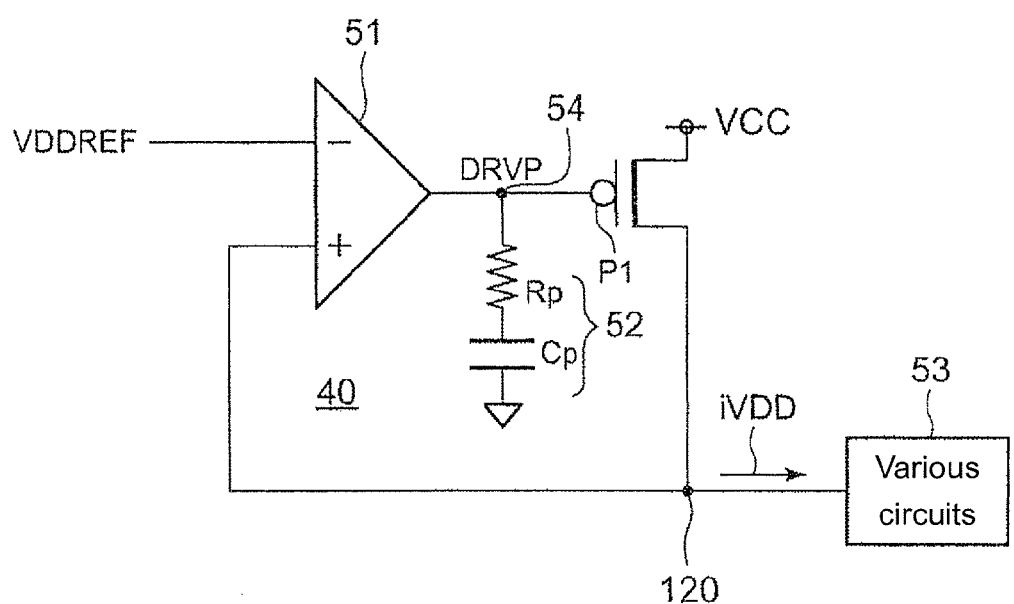
FIG. 2 is a circuit diagram illustrating a structure of the internal power supply voltage generating circuit 11 in FIG. 1.

FIG. 2 is a circuit diagram illustrating a structure of the internal power supply voltage generating circuit 11 in FIG. 1. The internal power supply voltage generating circuit 11 in FIG. 2 includes: an internal power voltage adjusting circuit 40 including a differential amplifier 51, a P-channel MOS transistor P1 served as a driving transistor and a phase compensation circuit 52.

In the internal power voltage adjusting circuit 40 in FIG. 2, the reference voltage VDDREF is inputted to an inverted input terminal of the differential amplifier 51, the internal power voltage VDD outputted from the P-channel MOS transistor P1 connected to the external power voltage VCC is inputted to a non-inverted input terminal of the differential amplifier 51, and a control voltage (a comparison result voltage) from an output terminal of the differential amplifier 51 is applied to a gate of the P-channel MOS transistor P1 via a connection point 54. Further, the phase compensation circuit 52 including a series circuit of a resistor Rp and a capacitor Cp is connected at the connection point 54, and the voltage of the connection point 54 is said as DRVP. The internal power voltage adjusting circuit 40 constituted in aforesaid manner generates and maintains the predetermined internal power voltage VDD by the external power voltage VCC based on the reference voltage VDDREF, and supplies a power current iVDD to various circuits (loading circuit) 53 in the non-volatile memory device via an internal power line 120 of the internal power voltage VDD.

Figure 3:
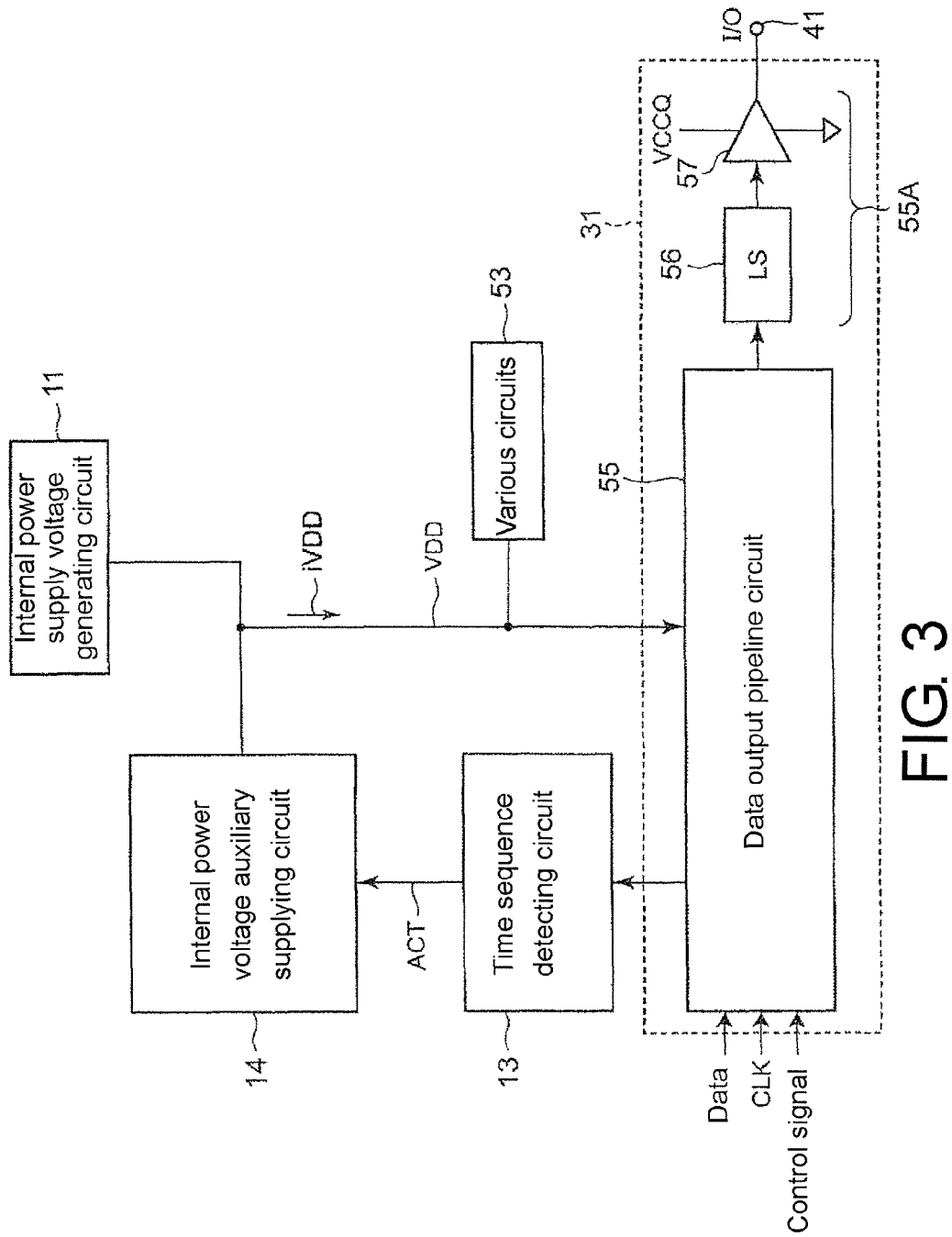
FIG. 3 is a block diagram illustrating a specific part in the non-volatile memory device in FIG. 1, and the block diagram illustrates a structure of circuit parts related to data output of the input/output buffer 31.

FIG. 3 is a block diagram illustrating a specific part in the non-volatile memory device in FIG. 1, and the block diagram illustrates a structure of circuit parts related to data output of the input/output buffer 31. In FIG. 3, the input/output buffer 31 is constituted by including a data output pipeline circuit 55, a level shifter (LS) 56, and a buffer amplifier 57 that operates by a predetermined external power voltage VCCQ. After the data signal, the clock and various control signals to be processed are inputted to the data output pipeline circuit 55 and then the data signal shifted to a predetermined external signal level by the level shifter 56 is outputted to the input/output terminal 41 via the buffer amplifier 57.

The time sequence detecting circuit 13 detects the predetermined time sequence based on the data signal in the input/output buffer 31, and generates and outputs the action indicating signal ACT based on the predetermined time sequence. The internal power voltage auxiliary supplying circuit 14 generates the predetermined auxiliary power voltage based on the action indication signal ACT (corresponding to enable pre signals ENB_PRE<7:0> in FIG. 5) in order to increase the supplied current to be supplied to the internal power line 120 of the internal power voltage VDD of the internal power supply voltage generating circuit 11. Herein, the internal power voltage VDD is supplied to the various circuits (loading circuit) 53 in the non-volatile memory device.

Figure 4:
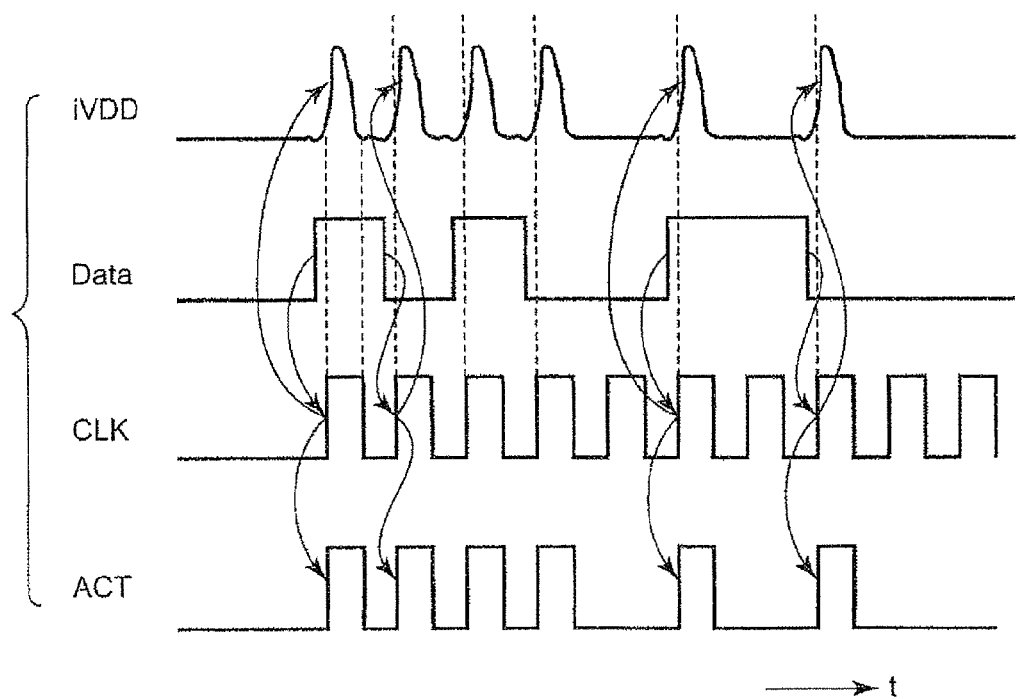
FIG. 4 illustrates a time sequence diagram of each signal in the circuit operation in FIG. 3.

FIG. 4 illustrates a time sequence diagram of each signal in the circuit operation in FIG. 3. If a greater variation occurs on the data signal inputted in the input/output buffer 31, the level shifter 56 and a logic gate 92 (referring to FIG. 5) for driving a final stage (i.e., the buffer amplifier 57 with a normally large size) of the input/output buffer 31 requires the power current iVDD to be relatively larger. Therefore, in the present embodiment, the transition of the data signal is detected before the data signal reaches the logic gate 92, and a detecting signal is generated as the action indicating signal ACT to be outputted to the internal power voltage auxiliary supplying circuit 14. That is, as shown in FIG. 4, when the action indicating signal ACT is generated synchronously as the data signal is rising or falling so that the internal power voltage auxiliary supplying circuit 14 starts operating to make the current iVDD of the internal power voltage VDD flow, an electrical charge of the auxiliary voltage is supplied to the internal power line 120 in order to complement the power current iVDD.

Figure 5:
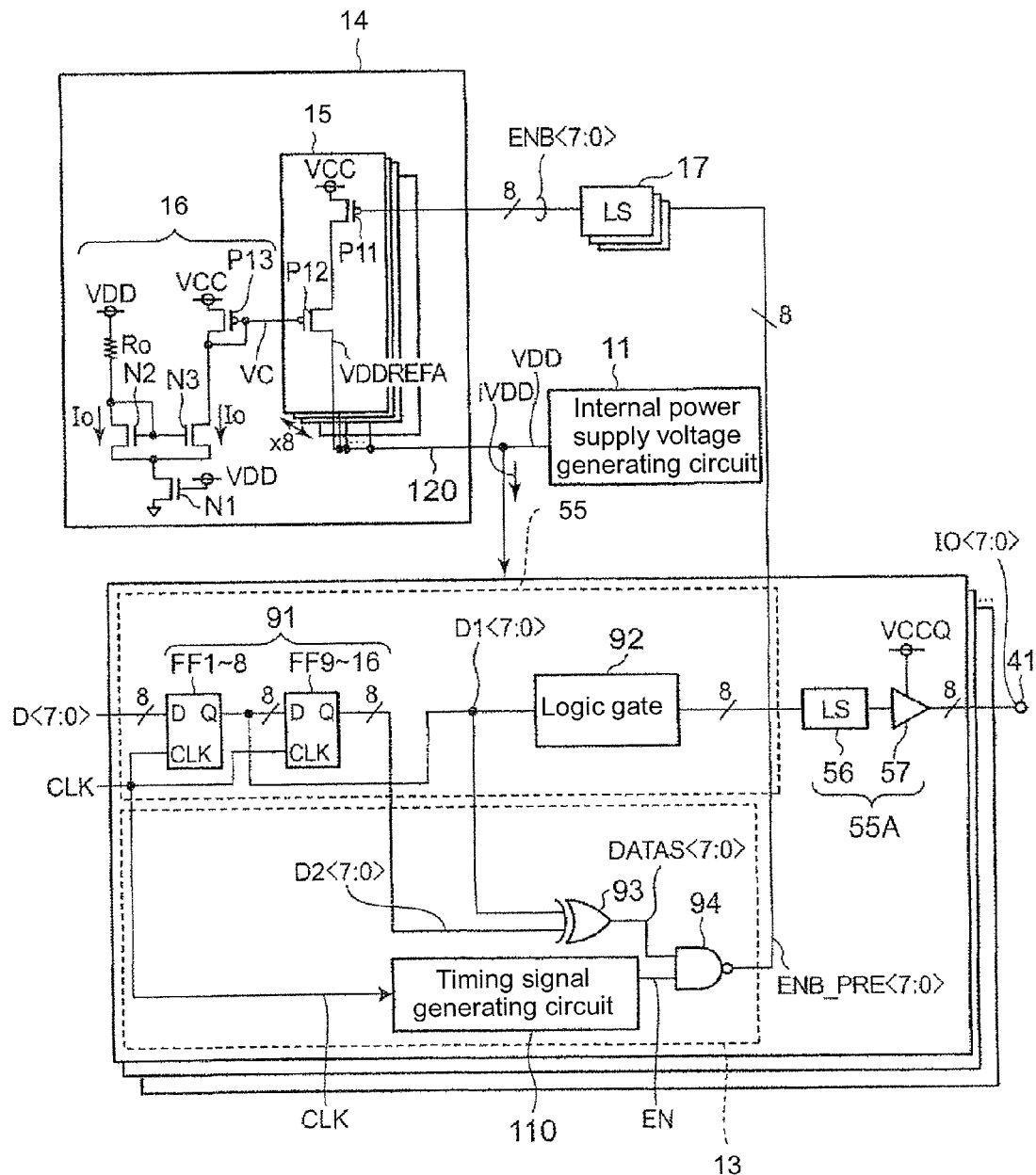
FIG. 5 is a circuit diagram illustrating a structure of the internal power voltage auxiliary supplying circuit 14, the level shifter 17, the data output pipeline circuit 55, the output processing circuit 55A and the time sequence detecting circuit 13 in FIG. 3.

FIG. 5 is a circuit diagram illustrating a structure of the internal power voltage auxiliary supplying circuit 14, the level shifter 17, the data output pipeline circuit 55, the output processing circuit 55A and the time sequence detecting circuit 13 in FIG. 3.

In FIG. 5, the input/output buffer 31 of FIG. 1 is constituted by including the data output pipeline circuit 55 and the output processing circuit 55A. The data output pipeline circuit 55 includes: a shift register 91, formed by a cascade connection of 2 sets of eight delay type flip-flops (D-flip flop) FF1 to FF8 and FF9 to FF16 (which are disposed in parallel for processing 8-bit data, respectively) in correspondence to each bit; and the logic gate 92, including a multi-stage gate and a predetermined logic. The output processing circuit 55A is constituted by including the level shifter 56 and the buffer amplifier 57. After being temporarily stored synchronously with a clock CLK by the delay type flip-flops FF1 to FF8, data signals D<7:0> are inputted as data signals D1<7:0> to the delay type flip-flops FF9 to FF16, the logic gate 92 and a first input terminal of an XOR gate 93. And then, the data signals from the logic gate 92 are outputted to the input/output terminal 42 via the output processing circuit 55A. After being inputted to the type flip-flops FF9 to FF16 and temporarily stored, the data signals D1<7:0> are inputted as data signals D2<7:0> to a second input terminal of the XOR gate 93. Further, the data signals D2<7:0> may be shifted in sequence synchronously with the clock CLK by the shift register 91 with respect to the data signals D<7:0>.

The time sequence detecting circuit 13 is constituted by including the XOR gate 93, a NAND gate 94 and a timing signal generating circuit 110. The XOR gate 93 outputs DATAS<7:0> as an operational result to a first input terminal of the NAND gate 94. On the other hand, the timing signal generating circuit 110 generates an enable signal EN synchronously with the clock CLK to be outputted to a second input terminal of the NAND gate 94. The NAND gate 94 generates the enable pre signals ENB_PRE<7:0> as an operational result to be outputted via the level shifter 17 as enable signals ENB<7:0> to an auxiliary voltage generating circuit 15. In addition, each of the following circuits includes a total of eight identical circuits of its own in correspondence to each bit of the enable pre signals ENB_PRE<7:0> and the enable signals ENB<7:0>. (1) the data output pipeline circuit 55, the output processing circuit 55A and the time sequence detecting circuit 13, (2) the level shifter 17, and (3) the auxiliary voltage generating circuit 15.

In addition, in each of following embodiments other than Embodiment 9 and Embodiment 10, each of auxiliary voltage generating circuits 15, 15Aa, 15A to 15F and an auxiliary voltage consuming circuit 15G also includes a total eight identical circuits of its own in correspondence to each bit of the enable signals ENB<7:0>. However, the above configuration is simply used as an example showing that the input/output terminal 41 is 8-bit wide. Naturally, the invention is also suitable for 16-bit wide or 64-bit wide.

The internal power voltage auxiliary supplying circuit 14 is constituted by including the auxiliary voltage generating circuit 15 and a control voltage generating circuit 16. The auxiliary voltage generating circuit 15 is constituted by including a P-channel MOS transistor P11 and a P-channel MOS transistor P12 connected in series. The external power voltage VCC is connected to a source of the P-channel MOS transistor P11, and a drain of the P-channel MOS transistor P12 becomes an auxiliary voltage output terminal. The enable signals ENB<7:0> from the level shifter 17 are applied to each of gates of the P-channel MOS transistors P11.

The control voltage generating circuit 16 is constituted by including a P-channel MOS transistor P13, three N-channel MOS transistors N1 to N3 and a resistor R0. The internal power voltage VDD is applied to a gate of the N-channel MOS transistor N1 so that the N-channel MOS N1 constantly stays on. The internal power voltage VDD is connected to the resistor R0 to make a predetermined current I0 flow through the resistor R0, and the current I0 flow to the N-channel MOS transistor N2. Further, the N-channel MOS transistor N2 and the N-channel MOS transistor N3 constitute a current mirror circuit. Accordingly, the corresponding current I0 also flow to the P-channel MOS transistor P13 connected to the external power voltage VCC and the N-channel MOS transistor N3. In this case, a drain voltage of the N-channel MOS transistor N3 is applied as a control voltage VC to each of gates of the P-channel MOS transistors P12, and the P-channel MOS transistor P12 and the P-channel MOS transistor P13 constitute a current mirror circuit.

Further, the enable signals ENB<7:0> of the internal power voltage auxiliary supplying circuit 14 are delayed by at least three logic gates versus the data signals D1<7:0>. Other the other hand, the data signals D1<7:0> instantly enter the logic gate circuit 92, and thus the enable signals ENB<7:0> cannot keep up with operations of first few stage of the logic gate circuit 92. However, because circuits consuming large current are mainly of back-end stages, such delay does not cause problems.

In the internal power voltage auxiliary supplying circuit 14 constituted in aforesaid manner, according to the enable signals ENB<7:0>, the P-channel MOS transistor P11 is turned on, a current flow to the P-channel MOS transistor P12 controlled according to the control voltage VC and the P-channel MOS transistor P11 connected in series with the P-channel MOS transistor P12, and the electrical charge is supplied from the auxiliary voltage generating circuit 15 to the internal power line 120, so as to complement the electrical charge consumed by the power current iVDD. Herein, a drain voltage of the P-channel MOS transistor P12 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

Figure 6:
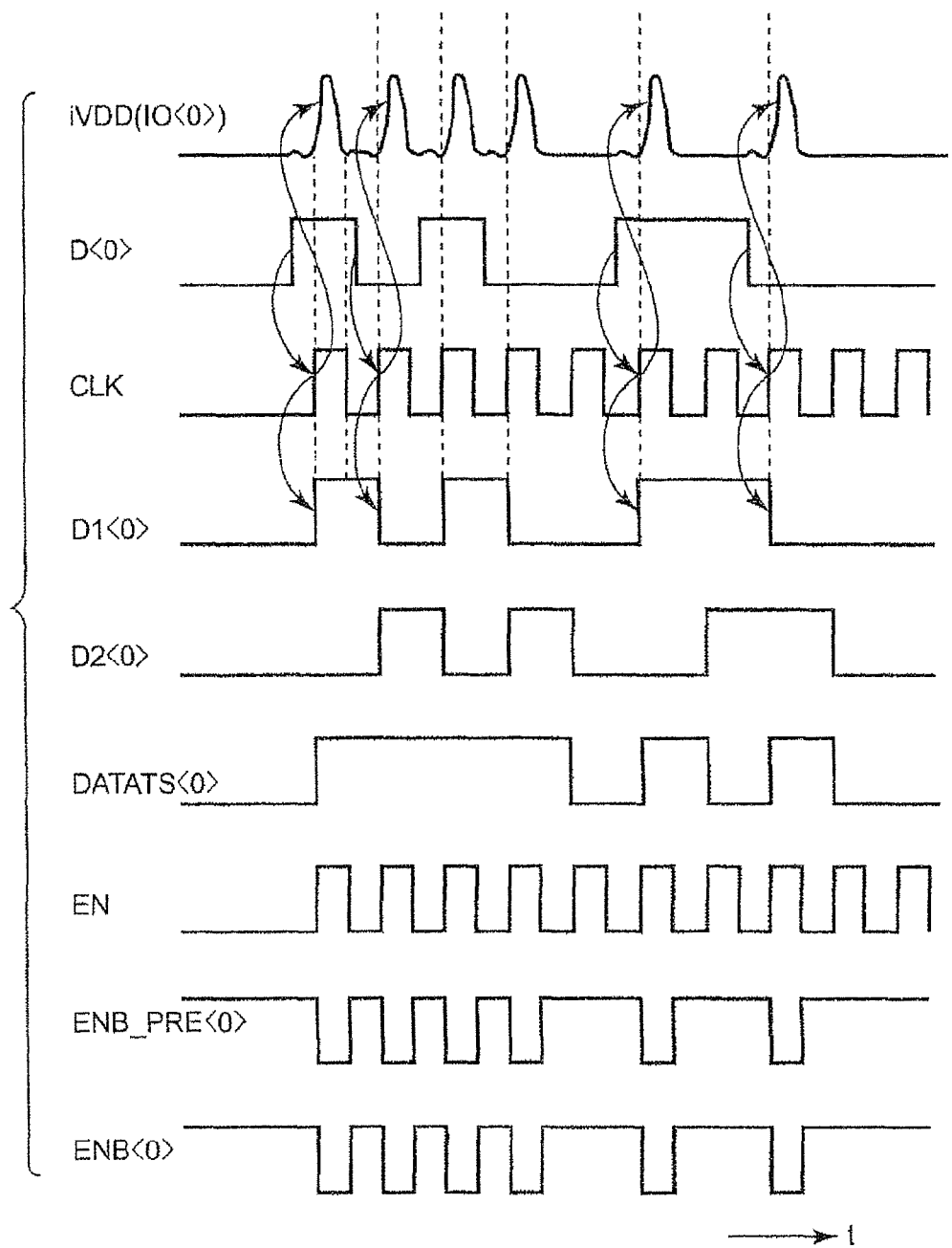
FIG. 6 illustrates a time sequence diagram of each signal in the circuit operation in FIG. 5.

FIG. 6 illustrates a time sequence diagram of each signal in the circuit operation in FIG. 5. As shown in FIG. 6, when the enable signals ENB_PRE<7:0> are generated synchronously as the data signal is rising or falling so that the internal power voltage auxiliary supplying circuit 14 starts operating to make the current iVDD of the internal power voltage VDD flow, the electrical charge is supplied from the auxiliary voltage generating circuit 15 to the internal power line 120, so as to complement the electrical charge consumed by the power current iVDD.

As a result, according to the present embodiment, the data reading may be performed with the speed higher than that in the existing technology without greatly increasing the power consumption even when being used in the semiconductor memory device that performs the data reading with the DDR.

Embodiment 2

Figure 7A:
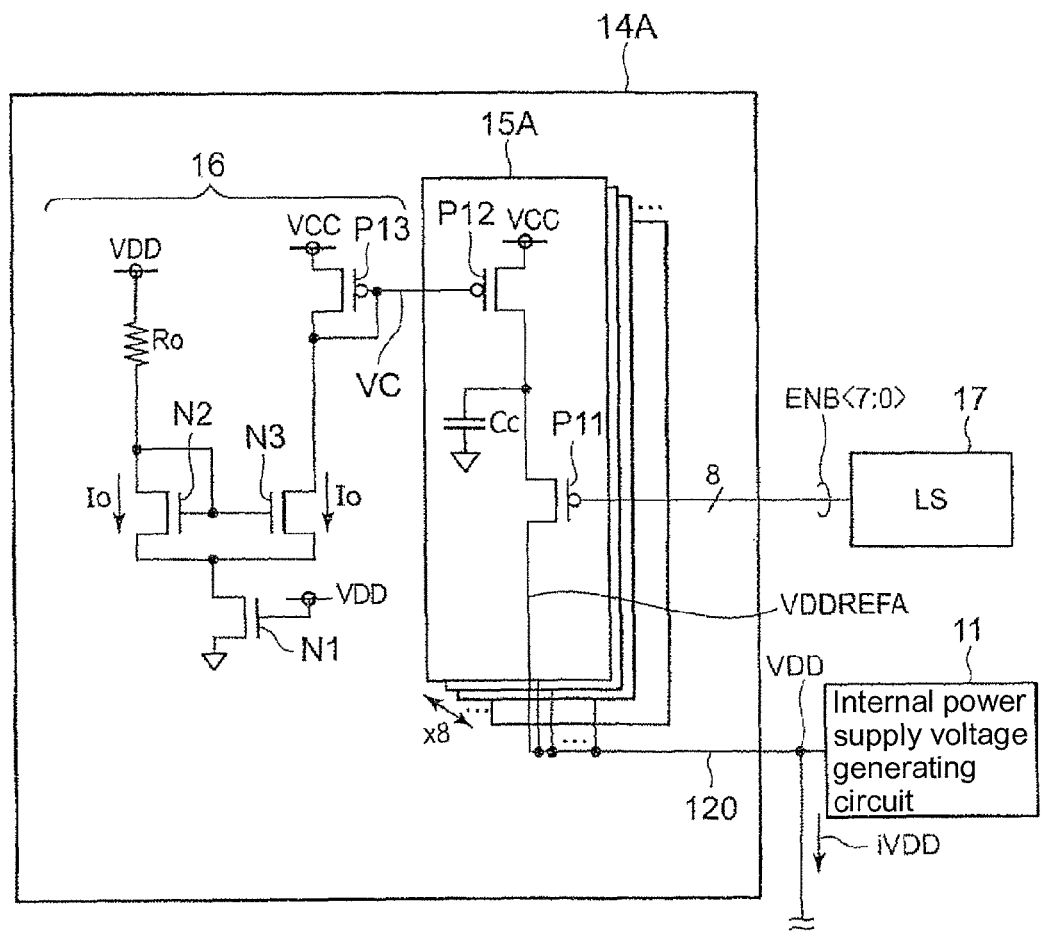
FIG. 7A is a circuit diagram illustrating a structure of an internal power voltage auxiliary supplying circuit 14A according to Embodiment 2 of the invention.

FIG. 7A is a circuit diagram illustrating a structure of an internal power voltage auxiliary supplying circuit 14A according to Embodiment 2 of the invention. Differences between the internal power voltage auxiliary supplying circuit 14A in Embodiment 2 and the internal power voltage auxiliary supplying circuit 14 in Embodiment 1 are provided as follows. (1) The auxiliary voltage generating circuit 15A is provided as a replacement of the auxiliary voltage generating circuit 15. (2) The auxiliary voltage generating circuit 15A is constituted by including the P-channel MOS transistor P12, a charging capacitor Cc and the P-channel MOS transistor P11 between the external power voltage VCC and the internal power line 120.

In FIG. 7A, in the auxiliary voltage generating circuit 15A, according to the enable signals ENB<7:0>, the P-channel MOS transistor P11 is turned on, a current flow to the P-channel MOS transistor P12 controlled according to the control voltage VC and the P-channel MOS transistor P11 connected in series with the P-channel MOS transistor P12, and an electrical charge is supplied from the auxiliary voltage generating circuit 15A to the internal power line 120, so as to complement the electrical charge consumed by the power current iVDD. The above operation is identical to that in Embodiment 1, however, in the present embodiment, the electrical charge is charged into the charging capacitor Cc when the P-channel MOS transistor is turned off. Accordingly, when the P-channel MOS transistor P11 is turned on according to the enable signals ENB<7:0>, the electrical charge may be supplied to the internal power line 120 more quickly as compared to Embodiment 1. Herein, a drain voltage of the P-channel MOS transistor P11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14A in Embodiment 2, besides the charging of the charging capacitor Cc, the same effect of the internal power voltage auxiliary supplying circuit 14 in Embodiment 1 may also be provided.

Modification of Embodiment 2

Figure 7B:
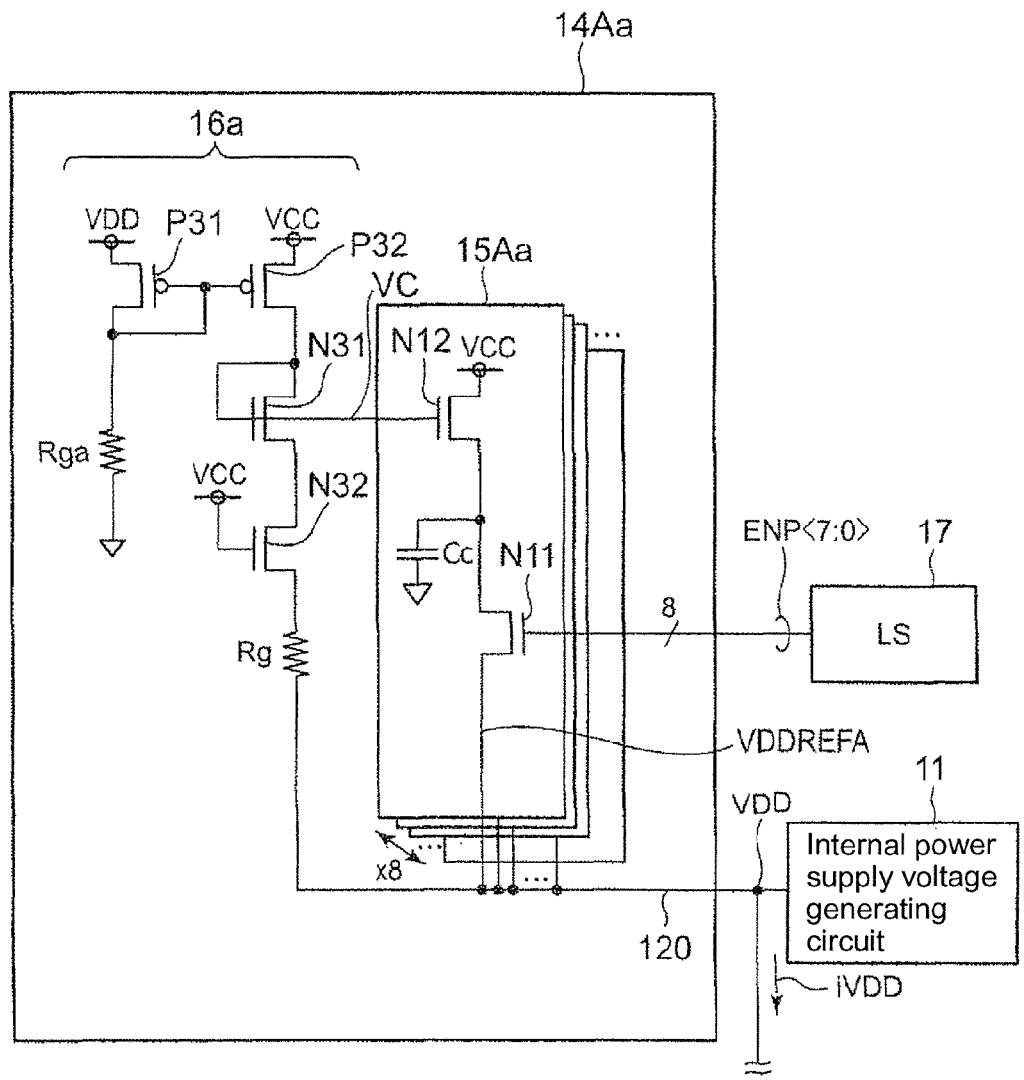
FIG. 7B is a circuit diagram illustrating a structure of an internal power voltage auxiliary supplying circuit 14Aa according to Modification of Embodiment 2 of the invention.

FIG. 7B is a circuit diagram illustrating a structure of an internal power voltage auxiliary supplying circuit 14Aa according to Modification of Embodiment 2 of the invention. Differences between the internal power voltage auxiliary supplying circuit 14Aa in Modification of Embodiment 2 and the internal power voltage auxiliary supplying circuit 14A in Embodiment 2 are provided as follows. (1) The auxiliary voltage generating circuit 15Aa is provided as a replacement of the auxiliary voltage generating circuit 15A. Herein, it is characterized in that, the PMOS transistor P11 and the PMOS transistor P12 are replaced by a NMOS transistor N11 and a NMOS transistor N12, and the auxiliary voltage generating circuit 15Aa is constituted by including the N-channel MOS transistor N12, the charging capacitor Cc and the N-channel MOS transistor N11 between the external power voltage VCC and the internal power line 120. (2) A control voltage generating circuit 16a is provided as a replacement of the control voltage generating circuit 16. Herein, it is especially characterized in that, the PMOS transistor P13 is replaced by a NMOS transistor N31 and a NMOS transistor N32, and the control voltage generating circuit 16a is constituted by including a P-channel MOS transistor P31, a P-channel MOS transistor P32, a N-channel MOS transistor N31, a N-channel MOS transistor N32, a resistor Rga and a resistor Rg. (3) The enable signals ENB<7:0> from the level shifter 17 are replaced by using their inverted signals (i.e., enable signals ENP<7:0>).

In FIG. 7B, in the auxiliary voltage generating circuit 15Aa, according to the enable signals ENP<7:0>, the N-channel MOS transistor N11 is turned on, a current flow to the N-channel MOS transistor N12 controlled according to the control voltage VC and the N-channel MOS transistor N11 connected in series with the N-channel MOS transistor N12.

As a result, in the internal power voltage auxiliary supplying circuit 14Aa in Modification of Embodiment 2, besides the different circuit structure, the same effect of the internal power voltage auxiliary supplying circuit 14A in Embodiment 2 may also be provided. Accordingly, in the following embodiments, the PMOS transistors may also be replaced by using the NMOS transistors.

Embodiment 3

Figure 8A:
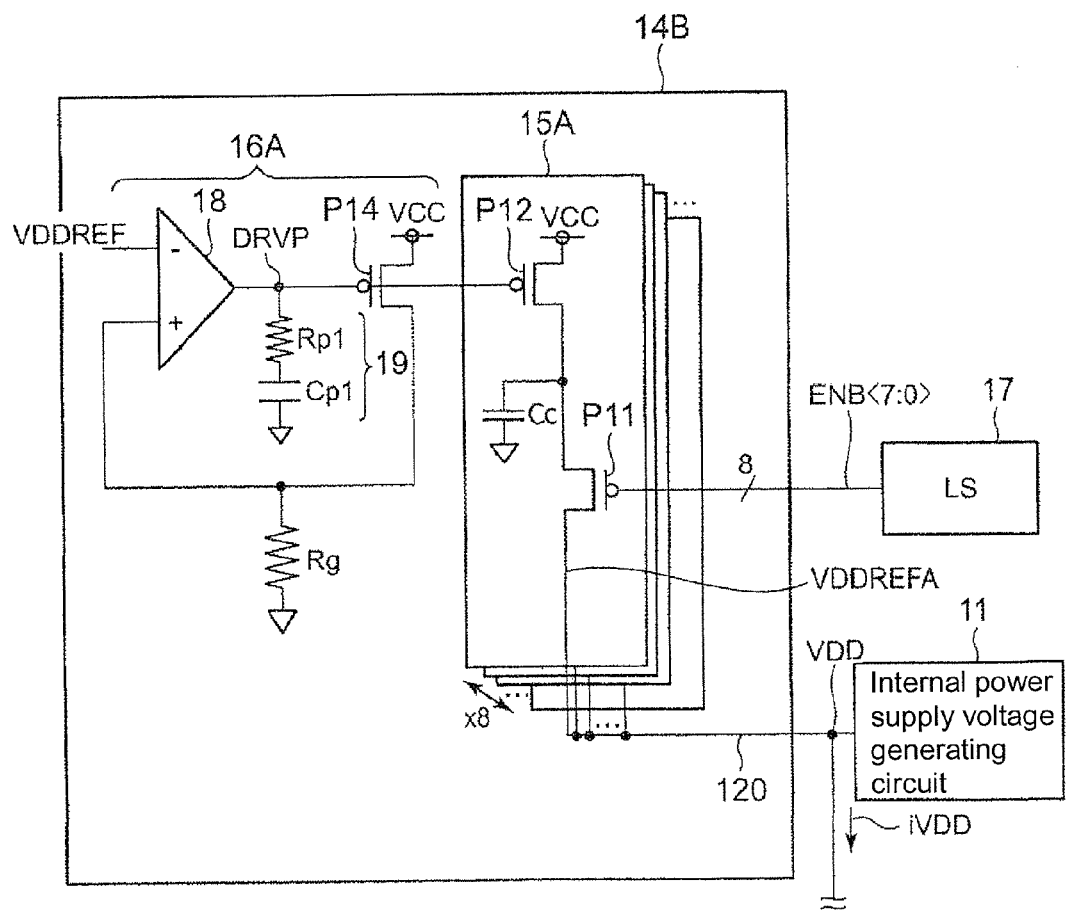
FIG. 8A is a circuit diagram illustrating a structure of an internal power voltage auxiliary supplying circuit 14B according to Embodiment 3 of the invention.

FIG. 8A is a circuit diagram illustrating a structure of an internal power voltage auxiliary supplying circuit 14B according to Embodiment 3 of the invention. Differences between the internal power voltage auxiliary supplying circuit 14B in Embodiment 3 and the internal power voltage auxiliary supplying circuit 14A in Embodiment 2 are provided as follows. (1) A control voltage generating circuit 16A is provided as a replacement of the control voltage generating circuit 16. (2) The control voltage generating circuit 16A uses a differential amplifier 18, a P-channel MOS transistor P14, a phase compensation circuit 19 including a resistor Rp1 and a capacitor Cp1, and the register Rg to constitute a regulator type circuit similar to the internal power supply voltage generating circuit 11 in FIG. 2 except for the connection of the register Rg.

In FIG. 8A, the control voltage generating circuit 16A generates a control voltage DRVP in a manner of voltage between two terminals of the resistor Rg corresponding the reference voltage VDDREF, and the control voltage DRVP is applied to each of gates of the P-channel MOS transistors P12, so as to control the current flowing to the P-channel MOS transistor P12. Herein, the P-channel MOS transistor P12 and the P-channel MOS transistor P14 constitute a current mirror circuit, so that the currents corresponding to each may flow. Further, in the control voltage generating circuit 16A, a voltage divided from the external power voltage VCC by the P-channel MOS transistor P14 and the resistor Rg is under a feedback control so as to be identical to the predetermined reference voltage VDDREF. Herein, generally, the reference voltage VDDREF applied to the differential amplifier 18 is set to be equal to the reference voltage VDDREF. However, the invention is not limited to the above, and the reference voltage VDDREF may also be set to be different from the reference voltage VDDREF (e.g., it can be set to be higher than or lower than the reference voltage VDDREF).

In the internal power voltage auxiliary supplying circuit 14B constituted in aforesaid manner, in the auxiliary voltage generating circuit 15A, according to the enable signals ENB<7:0>, the P-channel MOS transistor P11 is turned on, a current flow to the P-channel MOS transistor P12 controlled according to the control voltage DRVP and the P-channel MOS transistor P11 connected in series with the P-channel MOS transistor P12, and an electrical charge is supplied from the auxiliary voltage generating circuit 15A together with an electrical charge charged in the charging capacitor Cc to the internal power line 120, so as to complement the electrical charge consumed by the power current iVDD. Herein, a drain voltage of the P-channel MOS transistor P11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14B in Embodiment 3, besides the generation of the control voltage DRVP, the same effect of the internal power voltage auxiliary supplying circuit 14A in Embodiment 2 may also be provided.

Modification of Embodiment 3

Figure 8B:
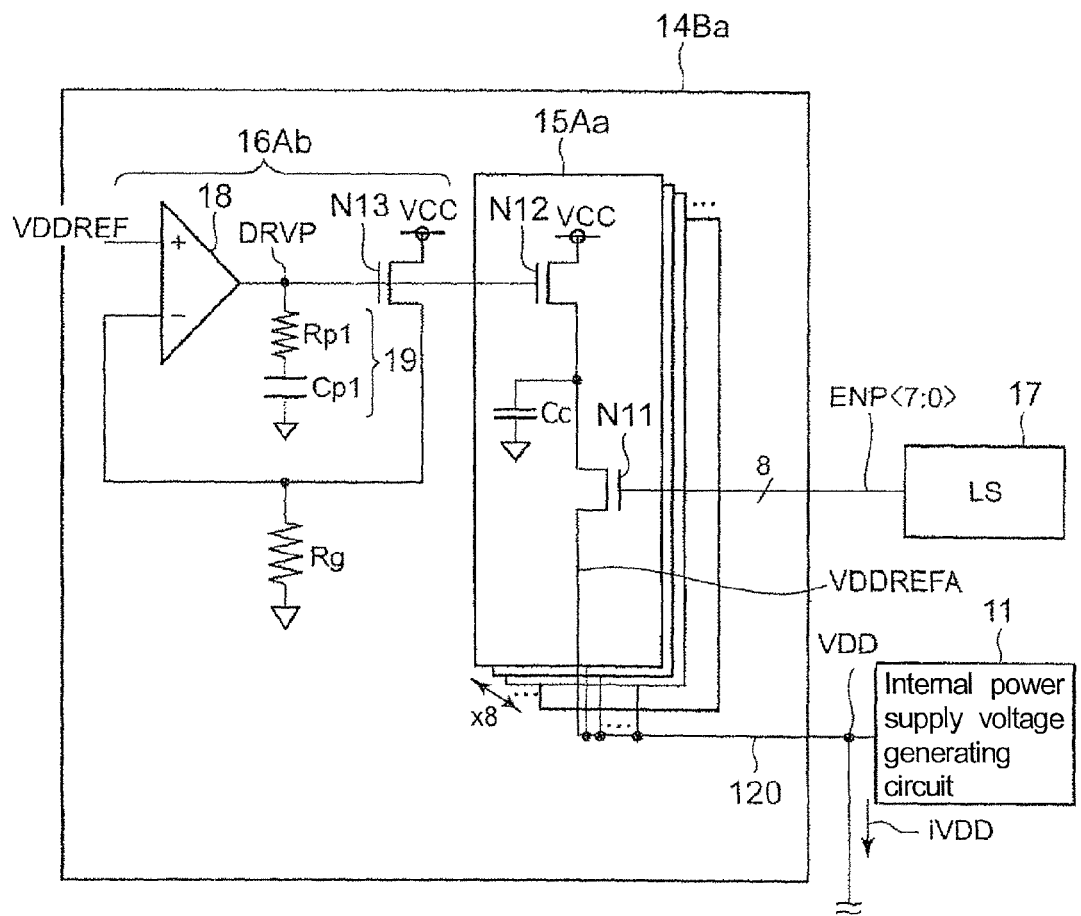
FIG. 8B is a circuit diagram illustrating a structure of an internal power voltage auxiliary supplying circuit 14Ba according to Modification of Embodiment 3 of the invention.

FIG. 8B is a circuit diagram illustrating a structure of an internal power voltage auxiliary supplying circuit 14Ba according to Modification of Embodiment 3 of the invention. Differences between the internal power voltage auxiliary supplying circuit 14Ba in Modification of Embodiment 3 and the internal power voltage auxiliary supplying circuit 14B in Embodiment 3 are provided as follows. (1) The auxiliary voltage generating circuit 15Aa in FIG. 7B is provided as a replacement of the auxiliary voltage generating circuit 15A. (2) A control voltage generating circuit 16Ab is provided as a replacement of the control voltage generating circuit 16A. Herein, in comparison with the control voltage generating circuit 16A, the control voltage generating circuit 16Ab is characterized in that, (i) a NMOS transistor N13 is provided as a replacement of the PMOS transistor P14; and (ii) two input signals for the differential amplifier 18 in the non-inverted input terminal and the inverted input terminal are exchanged. (3) The enable signals ENB<7:0> from the level shifter 17 are replaced by using their inverted signals (i.e., enable signals ENP<7:0>).

In FIG. 8B, the control voltage generating circuit 16Ab generates a control voltage DRVP in a manner of voltage between two terminals of the resistor Rg corresponding the reference voltage VDDREF, and the control voltage DRVP is applied to each of gates of the N-channel MOS transistors N13 and the N-channel MOS transistors N12, so as to control the current flowing to the N-channel MOS transistors N12. Further, in the control voltage generating circuit 16Ab, a voltage divided from the external power voltage VCC by the N-channel MOS transistor N13 and the resistor Rg is under a feedback control so as to be identical to the predetermined reference voltage VDDREF. Herein, generally, the reference voltage VDDREF applied to the differential amplifier 18 is, for example, set to be equal to the reference voltage VDDREF in Embodiment 1. However, the invention is not limited to the above, and the reference voltage VDDREF may also be set to be different from the reference voltage VDDREF in Embodiment 1 (e.g., it can be set to be higher than or lower than the reference voltage VDDREF in Embodiment 1).

In the internal power voltage auxiliary supplying circuit 14Ba constituted in aforesaid manner, in the auxiliary voltage generating circuit 15Aa, according to the enable signals ENP<7:0>, the N-channel MOS transistor N11 is turned on, a current flow to the N-channel MOS transistor N12 controlled according to the control voltage DRVP and the N-channel MOS transistor N11 connected in series with the N-channel MOS transistor N12, and an electrical charge charged to the charging capacitor Cc is supplied from the auxiliary voltage generating circuit 15Aa to the internal power line 120, so as to complement the electrical charge consumed by the power current iVDD. Herein, a drain voltage of the N-channel MOS transistor N11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14Ba in Modification of Embodiment 3, besides the different circuit structure, the same effect of the internal power voltage auxiliary supplying circuit 14B in Embodiment 3 may also be provided. Accordingly, in the following embodiments, the PMOS transistors may also be replaced by using the NMOS transistors.

Embodiment 4

Figure 9:
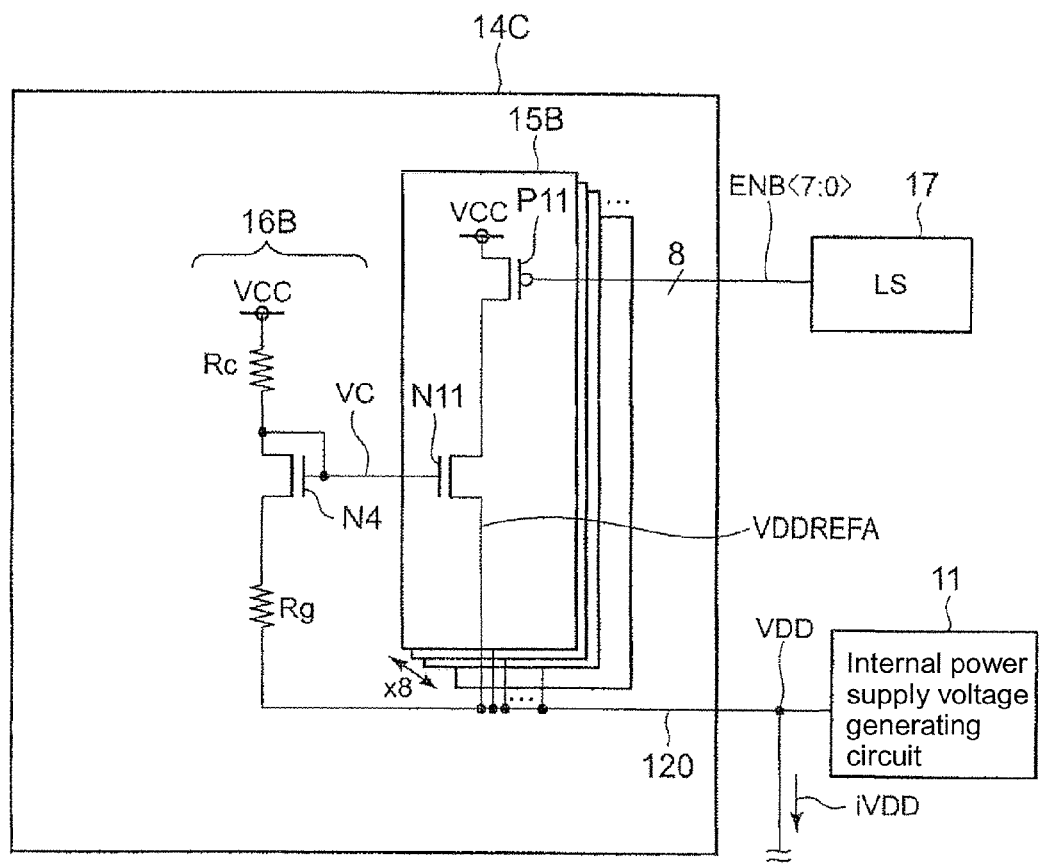
FIG. 9 is a circuit diagram illustrating a structure of an internal power voltage auxiliary supplying circuit 14C according to Embodiment 4 of the invention.

FIG. 9 is a circuit diagram illustrating a structure of an internal power voltage auxiliary supplying circuit 14C according to Embodiment 4 of the invention. Differences between the internal power voltage auxiliary supplying circuit 14C in Embodiment 4 and the internal power voltage auxiliary supplying circuit 14 in Embodiment 1 are provided as follows. (1) The auxiliary voltage generating circuit 15B is provided as a replacement of the auxiliary voltage generating circuit 15. (2) A control voltage generating circuit 16B is provided as a replacement of the control voltage generating circuit 16.

In FIG. 9, the auxiliary voltage generating circuit 15B is constituted by including the P-channel MOS transistor P11 and the N-channel MOS transistor N11 between the external power voltage VCC and the internal power line 120. The control voltage generating circuit 16B is constituted to be a source follower circuit by including a N-channel MOS transistor N4 and the resistor Rg between the external power voltage VCC and the internal power voltage VDD. The N-channel MOS transistor N4 and the N-channel MOS transistor N11 constitute a current mirror circuit, and a drain voltage of the N-channel MOS transistor N4 becomes the control voltage VC. In the control voltage generating circuit 16B, based on the external power voltage VCC, a current corresponding to a current flowed to a resistor Rc and the N-channel MOS transistor N4 flow to the N-channel MOS transistor N11.

In the auxiliary voltage generating circuit 15B, according to the enable signals ENB<7:0>, the P-channel MOS transistor P11 is turned on, a current flow to the N-channel MOS transistor N11 controlled according to the control voltage VC and the P-channel MOS transistor P11 connected in series with the N-channel MOS transistor N11, and an electrical charge is supplied from the auxiliary voltage generating circuit 15B to the internal power line 120 by the current, so as to complement the electrical charge consumed by the power current iVDD. Herein, a source voltage of the N-channel MOS transistor N11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14C in Embodiment 4, the same effect of the internal power voltage auxiliary supplying circuit 14 in Embodiment 1 may also be provided.

Embodiment 5

Figure 10:
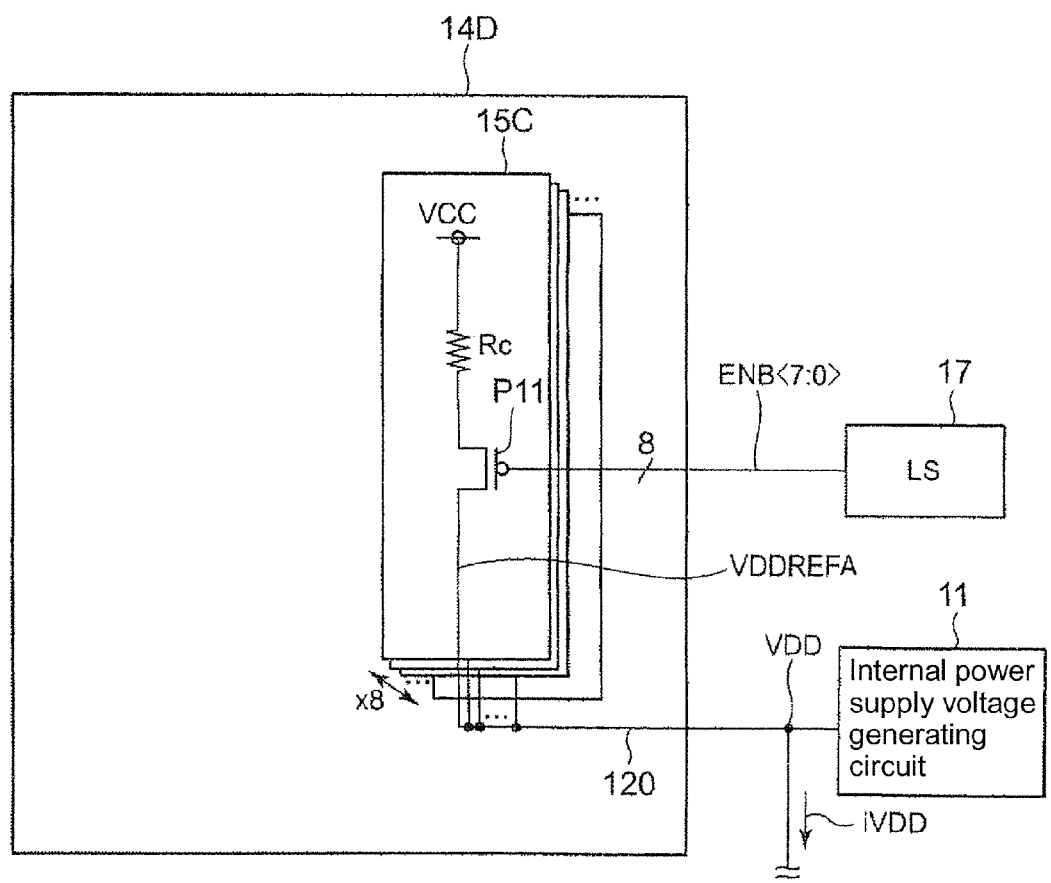
FIG. 10 is a circuit diagram illustrating a structure of an internal power voltage auxiliary supplying circuit 14D according to Embodiment 5 of the invention.

FIG. 10 is a circuit diagram illustrating a structure of an internal power voltage auxiliary supplying circuit 14D according to Embodiment 5 of the invention. Differences between the internal power voltage auxiliary supplying circuit 14D in Embodiment 5 and the internal power voltage auxiliary supplying circuit 14 in Embodiment 1 are provided as follows. (1) The auxiliary voltage generating circuit 15C is provided as a replacement of the auxiliary voltage generating circuit 15. (2) The control voltage generating circuit 16 is not disposed.

In FIG. 10, the auxiliary voltage generating circuit 15C is constituted by including the resistor Rc and the P-channel MOS transistor P11 between the external power voltage VCC and the internal power line 120. In the auxiliary voltage generating circuit 15C, according to the enable signals ENB<7:0>, the P-channel MOS transistor P11 is turned on, a current flow to the resistor Rc and the P-channel MOS transistor P11 based on the external power voltage VCC, and an electrical charge is supplied from the auxiliary voltage generating circuit 15C to the internal power line 120 by the current, so as to complement the electrical charge consumed by the power current iVDD. Herein, a drain voltage of the P-channel MOS transistor P11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14D in Embodiment 5, the same effect of the internal power voltage auxiliary supplying circuit 14 in Embodiment 1 may also be provided.

Furthermore, in the auxiliary voltage generating circuit 15C, a circuit formed by using inverted signals of the enable signals ENB<7:0> as the enable signals and replacing the P-channel MOS transistor P11 by the N-channel MOS transistor may operate similarly as Modification of Embodiment 5.

Embodiment 6

Figure 11:
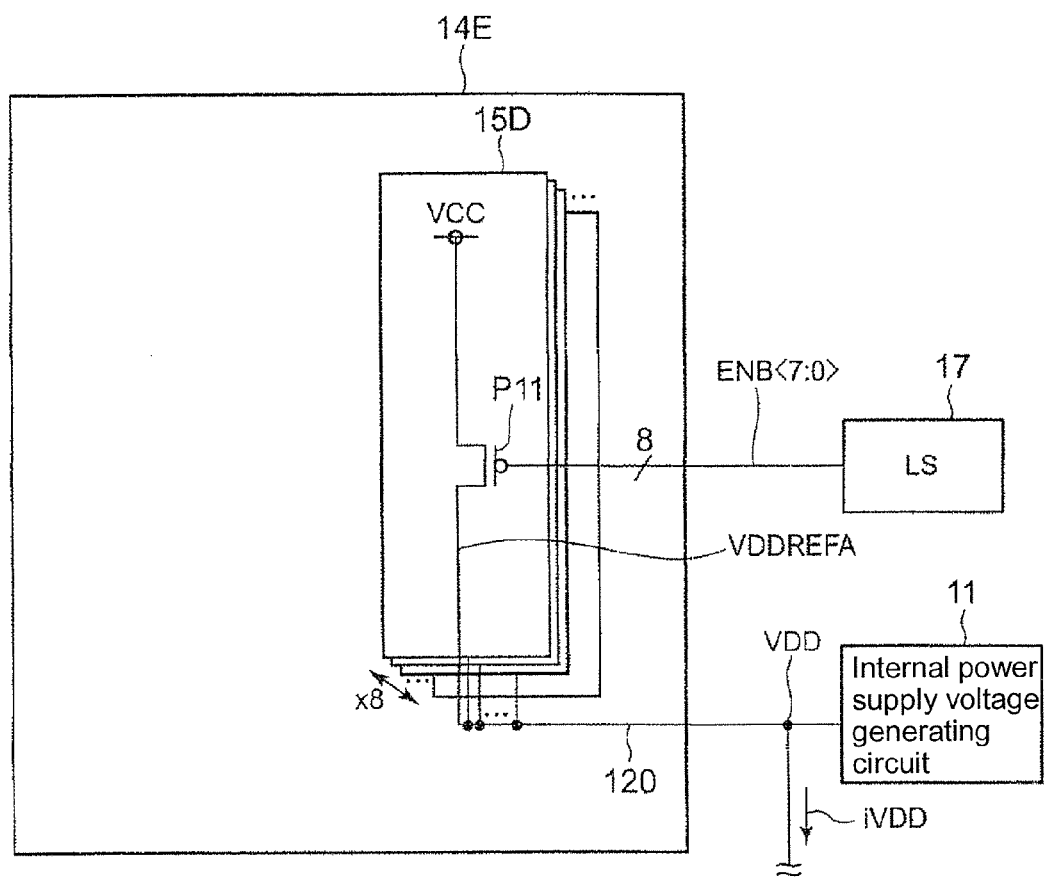
FIG. 11 is a circuit diagram illustrating a structure of an internal power voltage auxiliary supplying circuit 14E according to Embodiment 6 of the invention.

FIG. 11 is a circuit diagram illustrating a structure of an internal power voltage auxiliary supplying circuit 14E according to Embodiment 6 of the invention. Differences between the internal power voltage auxiliary supplying circuit 14E in Embodiment 6 and the internal power voltage auxiliary supplying circuit 14D in Embodiment 5 are provided as follows. (1) The auxiliary voltage generating circuit 15D is provided as a replacement of the auxiliary voltage generating circuit 15C.

In FIG. 11, the auxiliary voltage generating circuit 15D is constituted by only including the P-channel MOS transistor P11 between the external power voltage VCC and the internal power line 120. In the auxiliary voltage generating circuit 15D, according to the enable signal ENB<7:0>, the P-channel MOS transistor P11 is turned on, a current flow to the P-channel MOS transistor P11 based on the external power voltage VCC, and an electrical charge is supplied from the auxiliary voltage generating circuit 15D to the internal power line 120 by the current, so as to complement the electrical charge consumed by the power current iVDD. Herein, a drain voltage of the P-channel MOS transistor P11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14E in Embodiment 6, the same effect of the internal power voltage auxiliary supplying circuit 14D in Embodiment 5 may also be provided.

Furthermore, in the auxiliary voltage generating circuit 15D, a circuit formed by using inverted signals of the enable signals ENB<7:0> as the enable signals and replacing the P-channel MOS transistor P11 by the N-channel MOS transistor may operate similarly as Modification of Embodiment 6.

Embodiment 7

Figure 12:
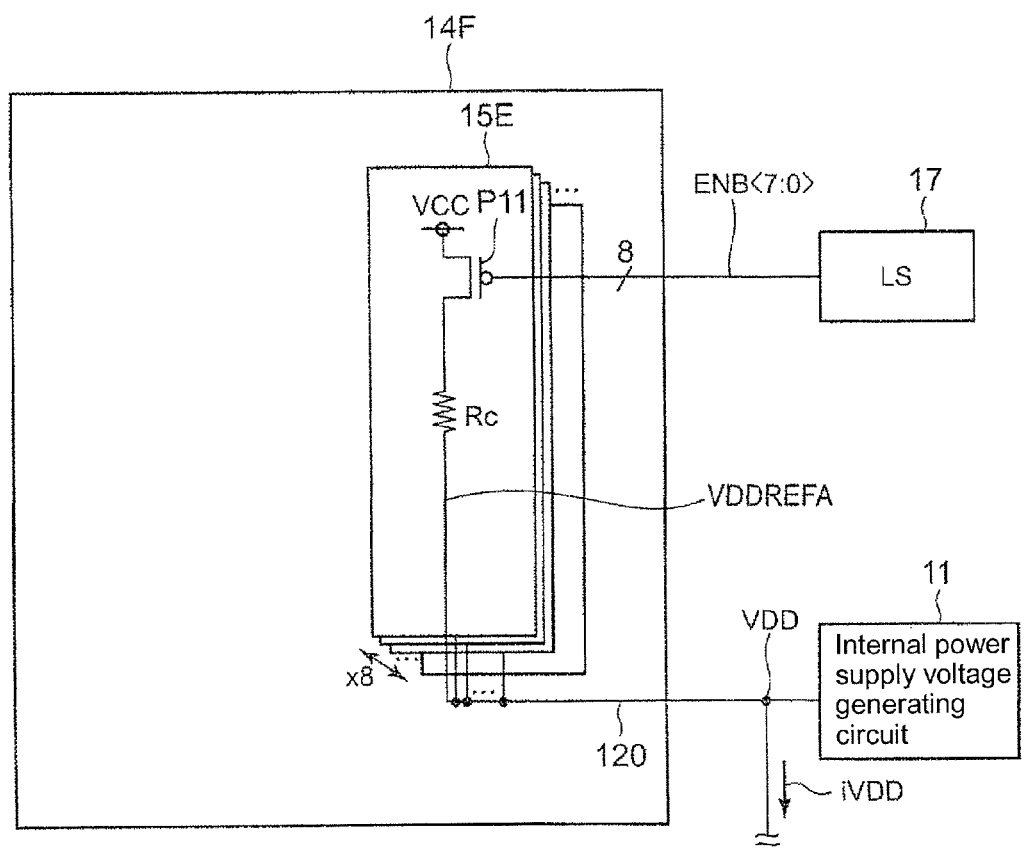
FIG. 12 is a circuit diagram illustrating a structure of an internal power voltage auxiliary supplying circuit 14F according to Embodiment 7 of the invention.

FIG. 12 is a circuit diagram illustrating a structure of an internal power voltage auxiliary supplying circuit 14F according to Embodiment 7 of the invention. Differences between the internal power voltage auxiliary supplying circuit 14F in Embodiment 7 and the internal power voltage auxiliary supplying circuit 14D in Embodiment 5 are provided as follows. (1) The auxiliary voltage generating circuit 15E is provided as a replacement of the auxiliary voltage generating circuit 15C, and the auxiliary voltage generating circuit 15E is constituted by exchanging inserted positions of the resistor Rc and the P-channel MOS transistor P11.

In the auxiliary voltage generating circuit 15E in FIG. 12, according to the enable signal ENB<7:0>, the P-channel MOS transistor P11 is turned on, a current flow to the P-channel MOS transistor P11 and the resistor Rc based on the external power voltage VCC, and an electrical charge is supplied from the auxiliary voltage generating circuit 15E to the internal power line 120 by the current, so as to complement the electrical charge consumed by the power current iVDD. Herein, a drain voltage of the P-channel MOS transistor P11 dropped by the voltage between the two terminals of the resistor Rc is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14F in Embodiment 7, the same effect of the internal power voltage auxiliary supplying circuit 14D in Embodiment 5 may also be provided.

Furthermore, in the auxiliary voltage generating circuit 15E, a circuit formed by using inverted signals of the enable signals ENB<7:0> as the enable signals and replacing the P-channel MOS transistor P11 by the N-channel MOS transistor may operate similarly as Modification of Embodiment 7.

Embodiment 8

Figure 13:
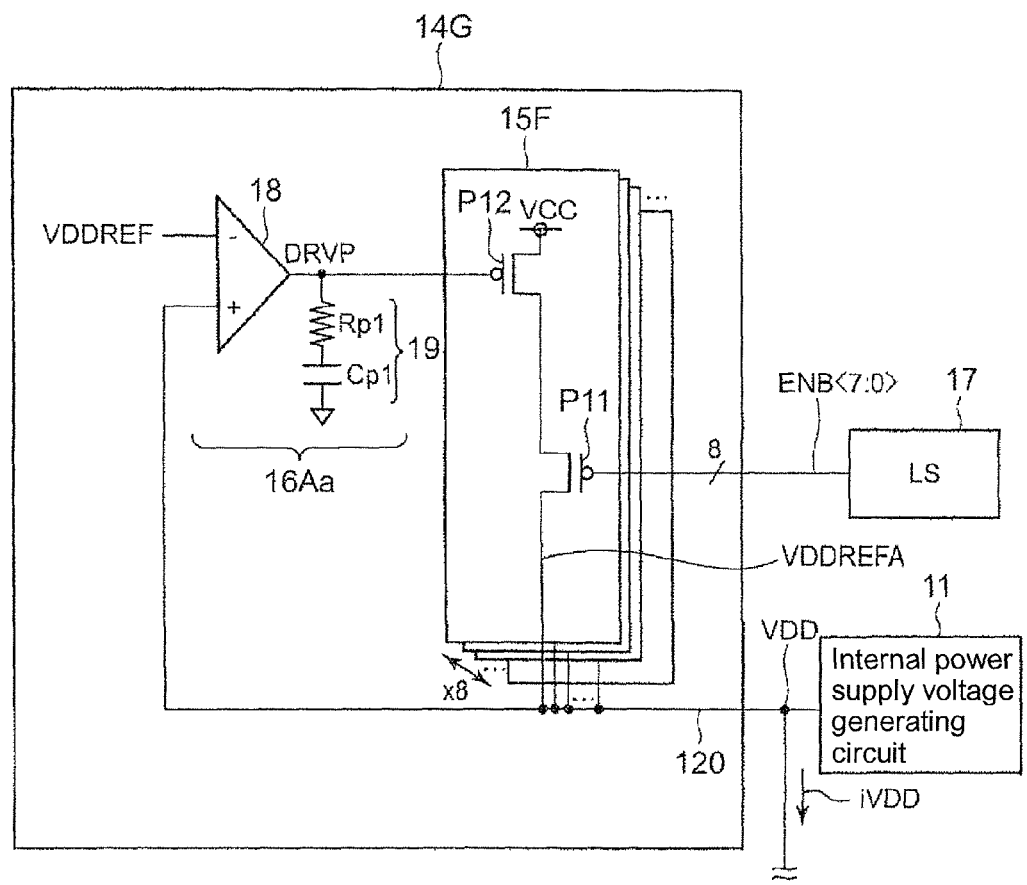
FIG. 13 is a circuit diagram illustrating a structure of an internal power voltage auxiliary supplying circuit 14G according to Embodiment 8 of the invention.

FIG. 13 is a circuit diagram illustrating a structure of an internal power voltage auxiliary supplying circuit 14G according to Embodiment 8 of the invention. Differences between the internal power voltage auxiliary supplying circuit 14G in Embodiment 8 and the internal power voltage auxiliary supplying circuit 14B in Embodiment 3 are provided as follows. (1) The auxiliary voltage generating circuit 15F not including the charging capacitor Cc is provided as a replacement of the auxiliary voltage generating circuit 15A. (2) The control voltage generating circuit 16Aa not including the P-channel MOS transistor P14 and the resistor Rg is provided as a replacement of the control voltage generating circuit 16A.

In FIG. 13, the control voltage DRVP is applied to each of the gates of the P-channel MOS transistors P12, and the internal power line 120 is connected to the non-inverted input terminal of the differential amplifier 18 in the control voltage generating circuit 16Aa.

In the internal power voltage auxiliary supplying circuit 14G constituted in aforesaid manner, according to the enable signals ENB<7:0>, the P-channel MOS transistor P11 is turned on, a current flow to the P-channel MOS transistor P12 controlled according to the control voltage DRVP and the P-channel MOS transistor P11 connected in series with the P-channel MOS transistor P12, and an electrical charge is supplied from the auxiliary voltage generating circuit 15F to the internal power line 120 by the current, so as to complement the electrical charge consumed by the power current iVDD. Herein, a drain voltage of the P-channel MOS transistor P11 is fed back to the differential amplifier 18, and the drain voltage of the P-channel MOS transistor P11 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF). Herein, generally, the reference voltage VDDREF inputted to a comparator 70 is, for example, set to be equal to the reference voltage VDDREF in Embodiment 1. However, the invention is not limited to the above, and the reference voltage VDDREF may also be set to be different from the reference voltage VDDREF in Embodiment 1 (e.g., it can be set to be higher than or lower than the reference voltage VDDREF in Embodiment 1).

As a result, in the internal power voltage auxiliary supplying circuit 14G in Embodiment 8, besides the voltage control for the internal power line 120, the same effect of the internal power voltage auxiliary supplying circuit 14B in Embodiment 3 may also be provided.

In addition, the auxiliary voltage generating circuit 15F may also be configured to be a circuit including the charging capacitor Cc.

Embodiment 9

Figure 14:
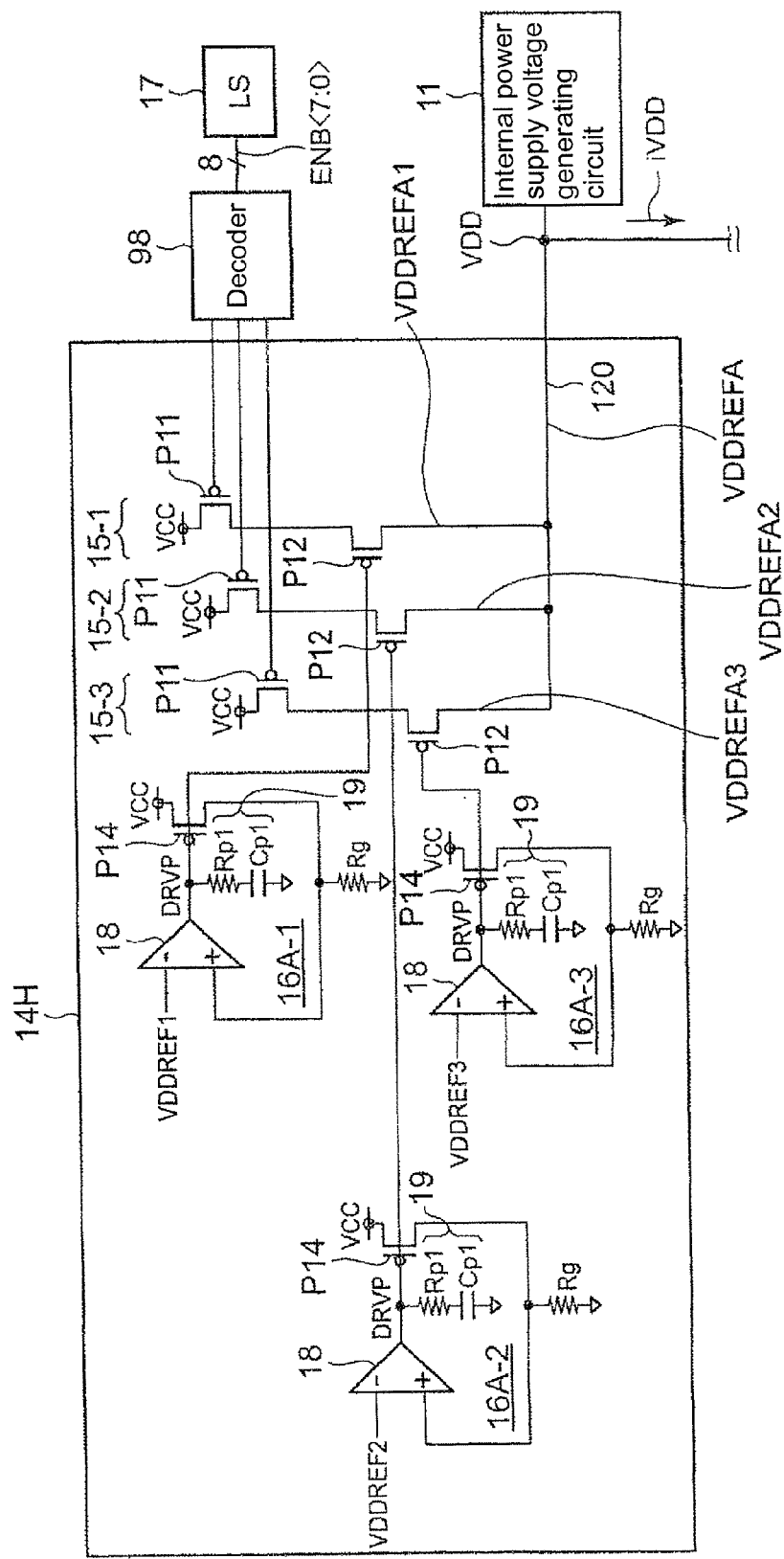
FIG. 14 is a circuit diagram illustrating a structure of an internal power voltage auxiliary supplying circuit 14H and the decoder 98 according to Embodiment 9 of the invention.

FIG. 14 is a circuit diagram illustrating a structure of an internal power voltage auxiliary supplying circuit 14H and the decoder 98 according to Embodiment 9 of the invention. Differences between the internal power voltage auxiliary supplying circuit 14 in Embodiment 9 and the internal power voltage auxiliary supplying circuit 14B in Embodiment 3 are provided as follows. (1) Three auxiliary voltage generating circuits 15-1 to 15-3 not including the charging capacitor Cc are provided as a replacement of the auxiliary voltage generating circuit 15A. Each of the auxiliary voltage generating circuits 15-1 to 15-3 is constituted by inserting the P-channel MOS transistor P11 and the P-channel MOS transistor P12 between the external power voltage VCC and the internal power line 120. (2) Three control voltage generating circuits 16A-1 to 16A-3 constituted by having the same structure of the control voltage generating circuit 16A are provided as a replacement of the control voltage generating circuit 16A. Further, in the control voltage generating circuits 16A-1 to 16A-3, a voltage divided from the external power voltage VCC by the P-channel MOS transistor P14 and the resistor Rg is under a feedback control so as to be identical to predetermined reference voltages VDDREF1 to VDDREF3. Herein, generally, the reference voltages VDDREF1 to VDDREF3 applied to the differential amplifier 18 are set to be equal to the reference voltage VDDREF. However, the invention is not limited to the above, and the reference voltages VDDREF1 to VDDREF3 may also be set to be different from the reference voltage VDDREF (e.g., it can be set to be higher than or lower than the reference voltage VDDREF). (3) A decoder 98 is further included, which decodes 8-bit enable signals ENB<7:0> from the level shifter 17 into 3-bit enable decoded signals, and applies the 3-bit enable decoded signals to each of gates of the P-channel MOS transistors P11 of the auxiliary voltage generating circuits 15-1 to 15-3.

In FIG. 14, a control voltage DRVP from the control voltage generating circuit 16A-1 is applied to a gate of the P-channel MOS transistor P12 of the auxiliary voltage generating circuit 15-1, and the control voltage generating circuit 16A-1 and the auxiliary voltage generating circuit 15-1 constitute a circuit that operates in correspondence to a first bit of the 3-bit enable decoded signals from the decoder 98. Further, a control voltage DRVP from the control voltage generating circuit 16A-2 is applied to a gate of the P-channel MOS transistor P12 of the auxiliary voltage generating circuit 15-2, and the control voltage generating circuit 16A-2 and the auxiliary voltage generating circuit 15-2 constitute a circuit that operates in correspondence to a second bit of the 3-bit enable decoded signals from the decoder 98. Further, a control voltage DRVP from the control voltage generating circuit 16A-3 is applied to a gate of the P-channel MOS transistor P12 of the auxiliary voltage generating circuit 15-3, and the control voltage generating circuit 16A-3 and the auxiliary voltage generating circuit 15-3 constitute a circuit that operates in correspondence to a third bit of the 3-bit enable decoded signals from the decoder 98.

In the auxiliary voltage generating circuit 15-1, a drain voltage of the P-channel MOS transistor P12 is adjusted into a predetermined reference voltage VDDREFA1 and then applied to the internal power line 120. Generally, the reference voltage VDDREFA1 is set to be equal to the reference voltage VDDREF. However, the invention is not limited to the above, and the reference voltage VDDREFA1 may also be set to be different from the reference voltage VDDREF (e.g., it can be set to be higher than or lower than the reference voltage VDDREF).

In the auxiliary voltage generating circuit 15-2, a drain voltage of the P-channel MOS transistor P12 is adjusted into a predetermined reference voltage VDDREFA2 and then applied to the internal power line 120. Generally, the reference voltage VDDREFA2 is set to be equal to the reference voltage VDDREF. However, the invention is not limited to the above, and the reference voltage VDDREFA2 may also be set to be different from the reference voltage VDDREF (e.g., it can be set to be higher than or lower than the reference voltage VDDREF).

In the auxiliary voltage generating circuit 15-3, a drain voltage of the P-channel MOS transistor P12 is adjusted into a predetermined reference voltage VDDREFA3 and then applied to the internal power line 120. Generally, the reference voltage VDDREFA3 is set to be equal to the reference voltage VDDREF. However, the invention is not limited to the above, and the reference voltage VDDREFA3 may also be set to be different from the reference voltage VDDREF (e.g., it can be set to be higher than or lower than the reference voltage VDDREF).

Further, a voltage combined by the drain voltages from each of the P-channel MOS transistors P12 in the auxiliary voltage generating circuits 15-1 to 15-3 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14H in Embodiment 9, besides the voltage control performed by the decoding of the decoder 98, the same effect of the internal power voltage auxiliary supplying circuit 14G in Embodiment 8 may also be provided. In the present embodiment, as compared to Embodiment 8, a circuit size of the internal power voltage auxiliary supplying circuit may be reduced to approximately ⅜.

Embodiment 10

Figure 15:
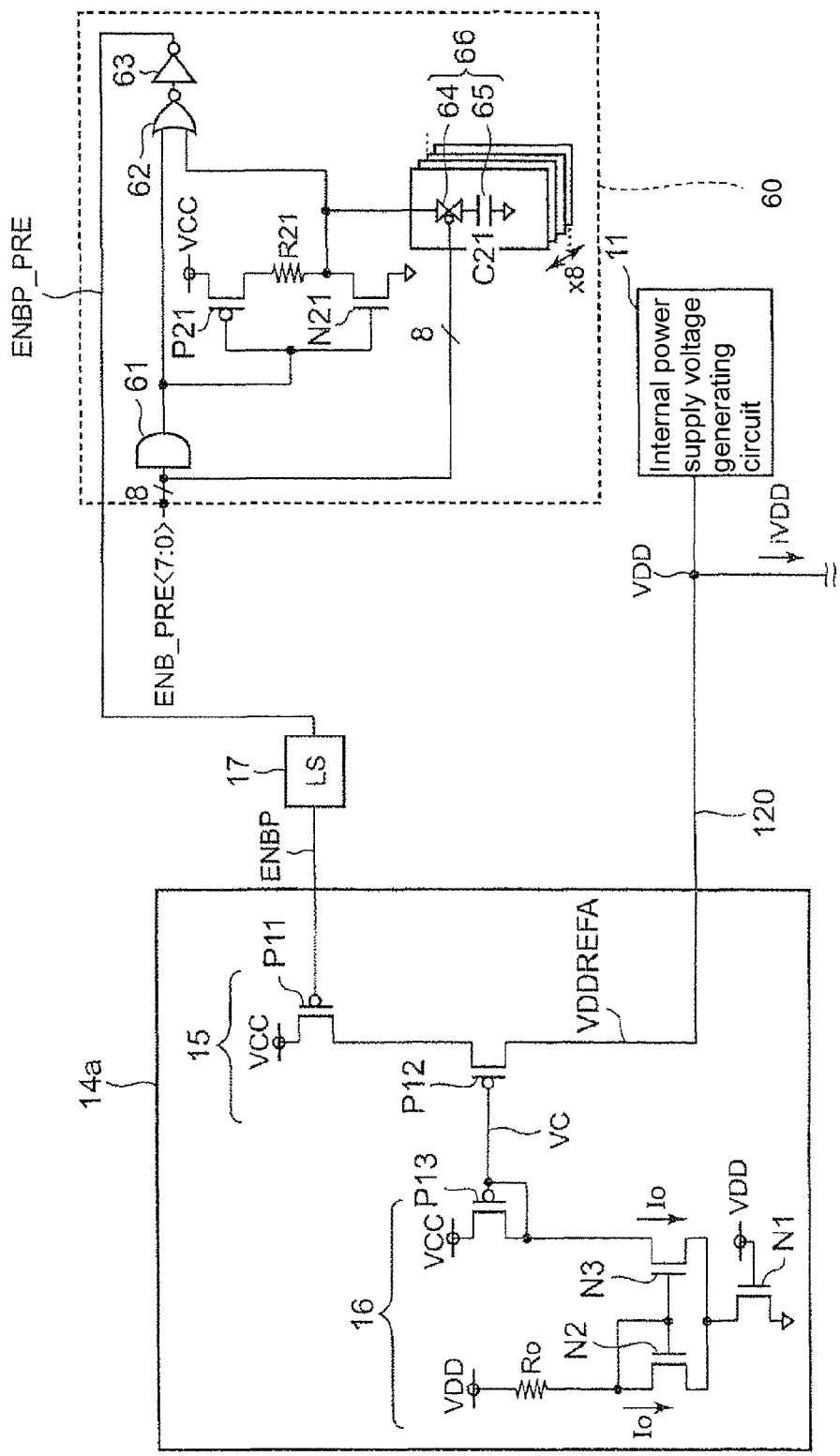
FIG. 15 is a circuit diagram illustrating a structure of an internal power voltage auxiliary supplying circuit 14a and the peripheral circuits thereof according to Embodiment 10 of the invention.
Figure 16:
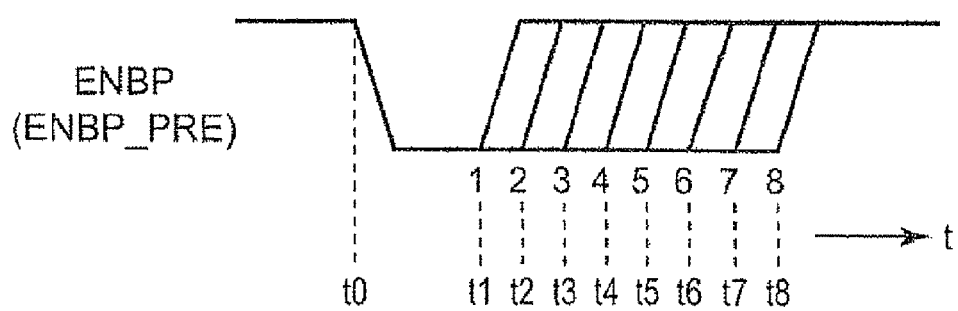
FIG. 16 illustrates a time sequence diagram of the enable signal ENBP in the circuit operation in FIG. 15.

FIG. 15 is a circuit diagram illustrating a structure of an internal power voltage auxiliary supplying circuit 14a and the peripheral circuits thereof according to Embodiment 10 of the invention. Further, FIG. 16 illustrates a time sequence diagram of the enable signal ENBP in the circuit operation in FIG. 15. Differences between the internal power voltage auxiliary supplying circuit 14a in Embodiment 10 and the internal power voltage auxiliary supplying circuit 14 in Embodiment 1 are provided as follows. (1) The internal power voltage auxiliary supplying circuit 14a is constituted by including the auxiliary voltage generating circuit 15 of 1-bit. In addition, the level shifter 17 connected to the gate of the PMOS transistor P11 of the auxiliary voltage generating circuit 15 of 1-bit includes the circuit of 1-bit. (2) A data migration counting circuit 60 is further included, which generates enable pre signals ENBP_PRE with a pulse width of 1-bit corresponding to 8 bits (referring to FIG. 16, the enable pre signals ENBP_PRE and the enable signals ENBP are only different in terms of the level), with respect to 8-bit enable pre signals ENB_PRE<7:0> from the time sequence detecting circuit 13.

The data migration counting circuit 60 in FIG. 15 is constituted by including an AND gate 61, a NOR gate 62, an inverter 63, a P-channel MOS transistor P21, a N-channel MOS transistor N21, a resistor R21 and eight capacitor circuits 66 constituted in correspondence to 8-bit, and each of the eight capacitor circuits 66 includes a transmission gate 64 and a capacitor 65 having a capacitance C21 identical to one another. The 8-bit enable pre signals ENB_PRE<7:0> from the time sequence detecting circuit 13 are inputted to the AND gate 61, and then inputted to each of the transmission gates 64 in the capacitor circuits 66. Herein, the 8-bit enable pre signals ENB_PRE<7:0> are of a low active signal, and so long as one bit of the 8-bit enable pre signals ENB_PRE<7:0> inputted to the AND gate 61 is at low level, an output level of the N-channel MOS transistor N21 becomes high level accordingly. On the other hand, for the 8-bit capacitor circuits 66, when a value obtained by multiplying a number of bits $M_{low}$ at low level in the 8-bit enable pre signals ENB_PRE<7:0> by the capacitance C21 is used as an overall capacitance, a RC time constant of the resistor R21 and the capacitor circuits 66 is $R21 \times N_{low} \times C21$.

In the data migration counting circuit 60 constituted in aforesaid manner, so long as one bit of the 8-bit enable pre signals ENB_PRE<7:0> is at low level, an output signal from the AND gate 62 also becomes low level accordingly. Then, after being inverted by the inverter including the MOS transistor P21 and the MOS transistor N21, an output terminal of the N-channel MOS transistor N21 becomes high level after passing a time determined by the time constant. Therefore, first of all, the enable pre signal ENBP_PRE is dropped to low level (at a time point t0). Then, the processed enable pre signal ENBP_PRE is raised to high level after passing the time corresponding to the number of bits at low level of the 8-bit enable pre signals ENB_PRE<7:0> delayed by the time constant (at one time point among a time point t1 to a time point t8). After the level of the enable pre signal ENBP_PRE is shifted by the level shifter 17, the enable pre signal ENBP_PRE is applied to the gate of P-channel MOS transistor P11 of the auxiliary voltage generating circuit 15 in the internal power voltage auxiliary supplying circuit 14a.

In the internal power voltage auxiliary supplying circuit 14a constituted in aforesaid manner, according to the enable signals ENBP with the pulse width corresponding to the number of bits at low level of the enable signals ENB<7:0>, the P-channel MOS transistor P11 is turned on, a current flow to the P-channel MOS transistor P12 controlled according to the control voltage VC and the P-channel MOS transistor P11 connected in series with the P-channel MOS transistor P12, and an electrical charge is supplied from the auxiliary voltage generating circuit 15 to the internal power line 120 by the current, so as to complement the electrical charge consumed by the power current iVDD. Herein, a drain voltage of the P-channel MOS transistor P12 is adjusted into a predetermined reference voltage VDDREFA and then applied to the internal power line 120. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

As a result, in the internal power voltage auxiliary supplying circuit 14a in Embodiment 10, besides the operation of the data migration counting circuit 60, the same effect of the internal power voltage auxiliary supplying circuit 14 in Embodiment 1 may also be provided.

In addition, the internal power voltage auxiliary supplying circuit 14a is not limited by what illustrated in FIG. 15, and may also be the internal power voltage auxiliary supplying circuit 14 and the internal power voltage auxiliary supplying circuits 14A to 14H in various embodiments recited in the present disclosure.

Embodiment 11

Figure 17:
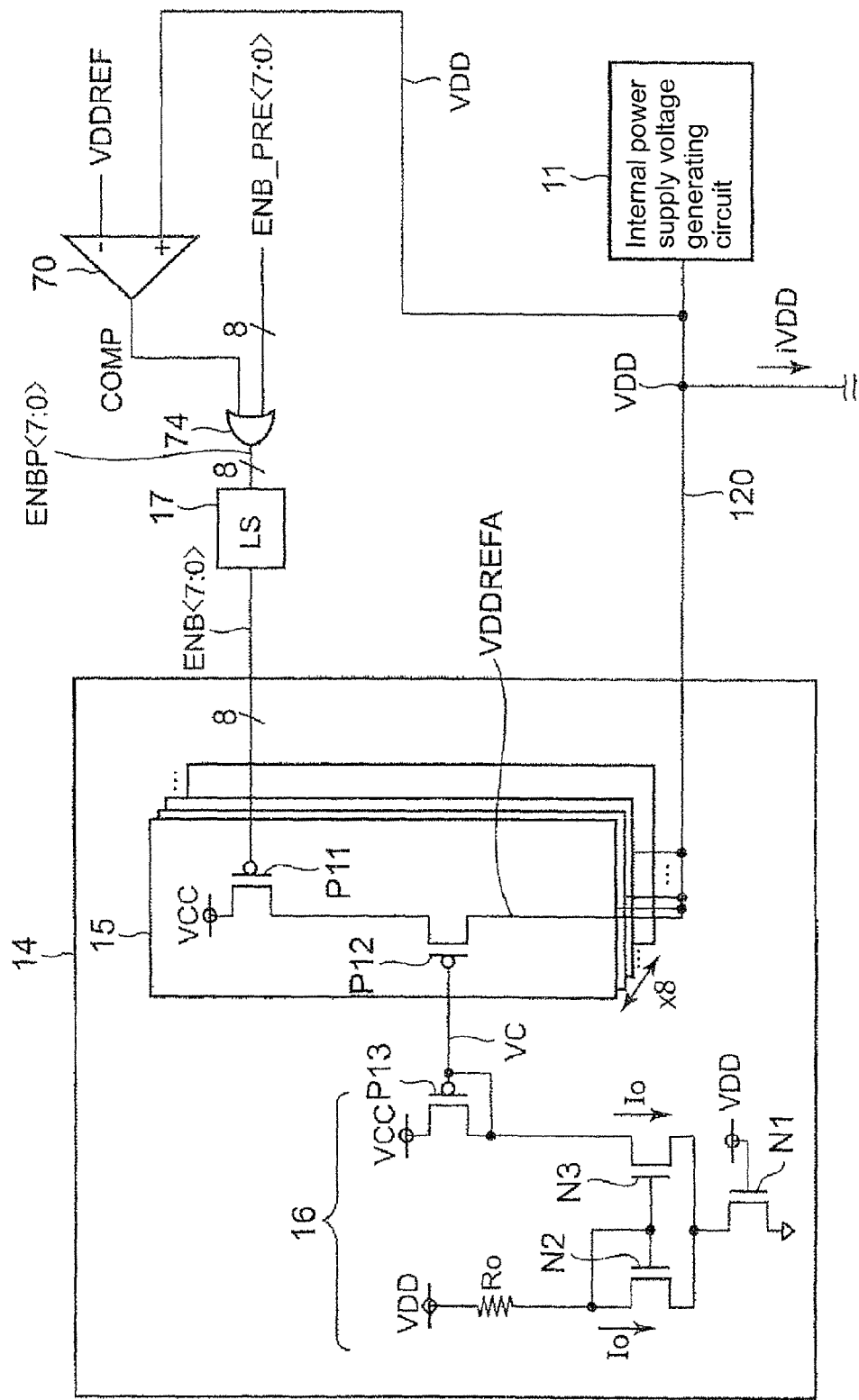
FIG. 17 is a circuit diagram illustrating a structure of an internal power voltage auxiliary supplying circuit 14 and the peripheral circuits thereof according to Embodiment 11 of the invention.

FIG. 17 is a circuit diagram illustrating a structure of an internal power voltage auxiliary supplying circuit 14 and the peripheral circuits thereof according to Embodiment 11 of the invention. The internal power voltage auxiliary supplying circuit 14 in Embodiment 11 shows an example with a circuit identical to the internal power voltage auxiliary supplying circuit 14 in Embodiment 1. However, there are differences between the peripheral circuits of the internal power voltage auxiliary supplying circuit 14 in Embodiment 11 and the peripheral circuits of the internal power voltage auxiliary supplying circuit 14 in Embodiment 1, which are provided as follows. (1) An OR gate 74 is further included between the time sequence detecting circuit 13 and the level shifter 17. (2) A comparator 70 is further included.

In FIG. 17, the comparator 70 compares the internal power voltage VDD with the reference voltage VDDREF to generate a comparison result signal COMP to be outputted to a first input terminal of the OR gate 74. On the other hand, each of the enable pre signals ENB_PRE<7:0> from the time sequence detecting circuit 13 is inputted to a second input terminal of the OR gate 74 of the corresponding bit, so then the OR gates 74 may output the enable signals ENBP<7:0>. In addition, the OR gate 74 operates in the following manner. In the circuit of Embodiment 1, if an enable pre signal ENB_PRE<n> is at low level, the internal power voltage auxiliary supplying circuit 14 starts to operate; but if the comparison result signal COMP is not at low level as well, the output of the OR gate 74 does not become low level. Therefore, in Embodiment 11, practically, the internal power voltage auxiliary supplying circuit 14 starts to operate only when the enable pre signal ENB_PRE<n> becomes low level, and further, the load current iVDD is increased to start dropping the internal power voltage VDD.

After the level being shifted by the level shifter 17, the 8-bit enable signals ENBP<7:0> from the OR gate 74 are applied to the gate of P-channel MOS transistor P11 of each of the auxiliary voltage generating circuits 15 in the internal power voltage auxiliary supplying circuit 14.

Figure 18A:
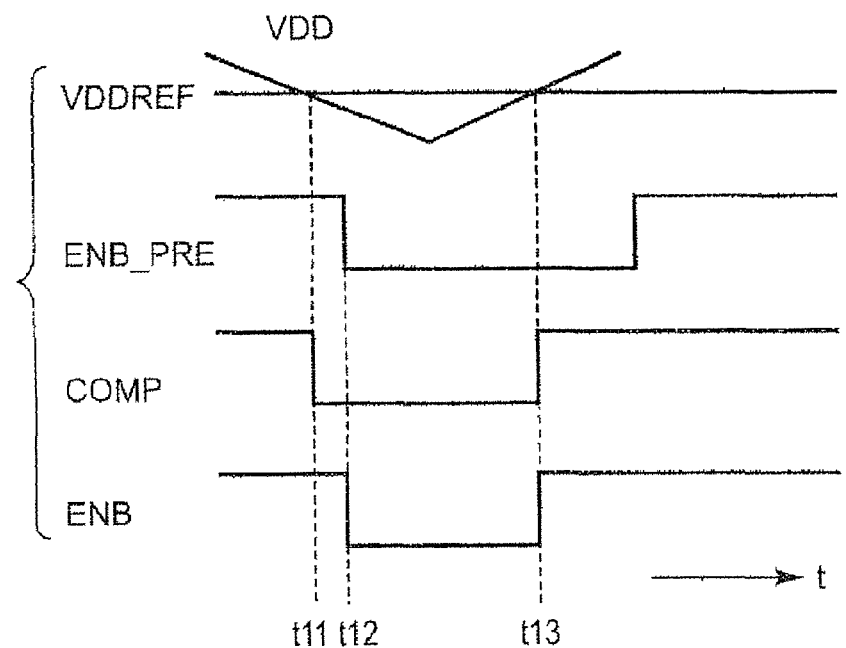
FIG. 18A illustrates a time sequence diagram of the circuit operation for Case 1 in FIG. 17.

FIG. 18A illustrates a time sequence diagram of the circuit operation for Case 1 in FIG. 17.

In FIG. 18A, when the internal power voltage VDD is dropped below the reference voltage VDDREF before the enable pre signal ENB_PRE becomes low (Case 1), the comparison result signal COMP goes to low level synchronously with a time that the internal power voltage VDD is dropped below the reference voltage VDDREF (at a time point t11). Thereafter, the enable pre signal ENB_PRE and the enable signal ENB become low (at a time point t12). Then, when the internal power voltage VDD reaches above the reference voltage VDDREF (at a time point t13), the comparison result signal COMP and the enable signal ENB is raised.

Figure 18B:
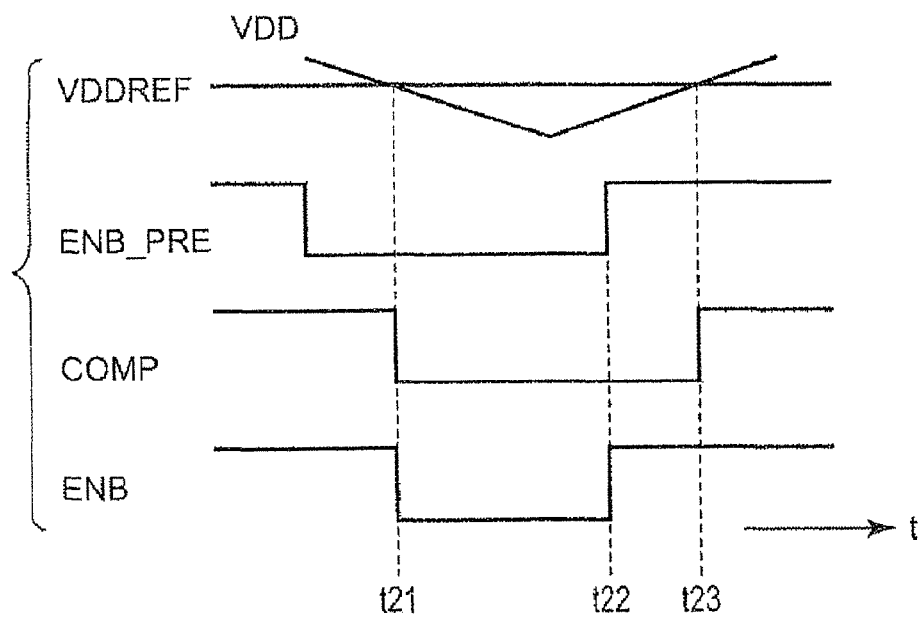
FIG. 18B illustrates a time sequence diagram of the circuit operation for Case 2 in FIG. 17.

FIG. 18B illustrates a time sequence diagram of the circuit operation for Case 2 in FIG. 17.

In FIG. 18B, when the internal power voltage VDD is dropped below the reference voltage VDDREF after the enable pre signal ENB_PRE goes to low level (Case 2), the comparison result signal COMP and the enable signal ENB go to low level synchronously when a time that the internal power voltage VDD is dropped below the reference voltage VDDREF (at a time point t21). Then, the enable signal ENB and the enable signal ENB_PRE are raised (at a time point t22). Thereafter, when the internal power voltage VDD reaches above the reference voltage VDDREF, the comparison result signal COMP is raised (at a time point t23).

As such, according to the present embodiment, besides the effectiveness in Embodiment 1, the enable signal ENB may also be generated according to a comparison result of the internal power voltage VDD and the reference voltage VDDREF. Therefore, as compared to Embodiment 1, the present embodiment allows the auxiliary voltage generating circuit 15 to operate more reliably.

Herein, generally, the reference voltage VDDREF inputted to the comparator 70 is, for example, set to be equal to the reference voltage VDDREF in Embodiment 1. However, the invention is not limited to the above, and the reference voltage VDDREF may also be set to be different from the reference voltage VDDREF in Embodiment 1 (e.g., it can be set to be higher than or lower than the reference voltage VDDREF in Embodiment 1).

Embodiment 12

Figure 19:
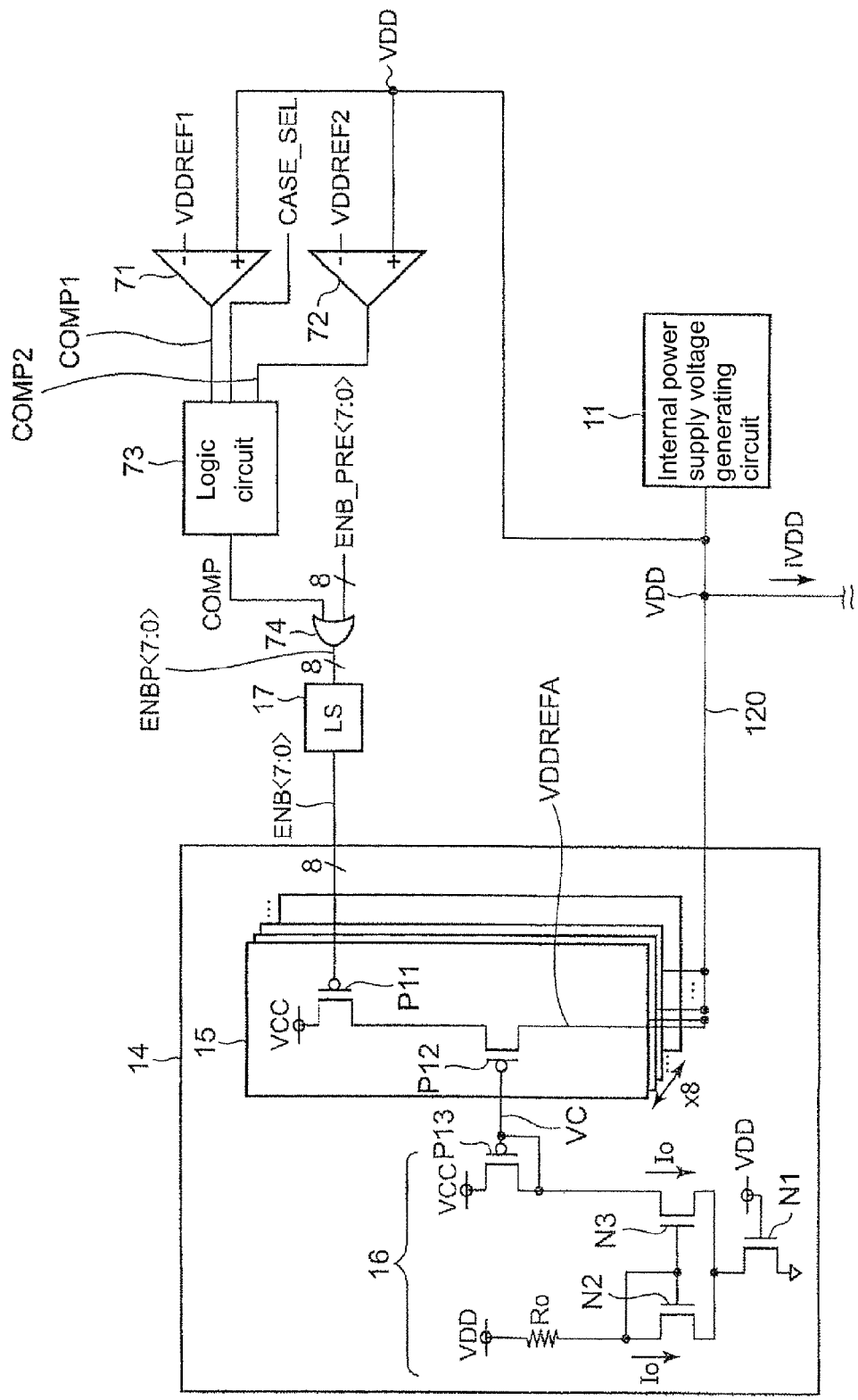
FIG. 19 is a circuit diagram illustrating a structure of an internal power voltage auxiliary supplying circuit 14 and the peripheral circuits thereof according to Embodiment 12 of the invention.

FIG. 19 is a circuit diagram illustrating a structure of an internal power voltage auxiliary supplying circuit 14 and the peripheral circuits thereof according to Embodiment 12 of the invention. The internal power voltage auxiliary supplying circuit 14 in Embodiment 12 shows an example with a circuit identical to the internal power voltage auxiliary supplying circuit 14 in Embodiment 1. However, there are differences between the peripheral circuits of the internal power voltage auxiliary supplying circuit 14 in Embodiment 12 and the peripheral circuits of the internal power voltage auxiliary supplying circuit 14 in Embodiment 1, which are provided as follows. (1) The OR gate 74 is further included between the time sequence detecting circuit 13 and the level shifter 17. (2) A comparator 71, a comparator 72 and a logic circuit 73 are further included.

In FIG. 19, the comparator 71 compares the internal power voltage VDD with a first reference voltage VDDREF1 to generate a comparison result signal COMP1 to be outputted to the logic circuit 73. Further, the comparator 72 compares the internal power voltage VDD with a second reference voltage VDDREF2 (<VDDREF1) to generate a comparison result signal COMP2 to be outputted to the logic circuit 73. After executing a predetermined logic process (which will be described in detail later) based on a predetermined case selecting signal CASE_SEL, the comparison result signal COMP1 and the comparison result signal COMP2, the logic circuit 73 outputs the comparison result signal COMP to the first input terminal of the OR gate 74. On the other hand, each of the enable pre signals ENB_PRE<7:0> from the time sequence detecting circuit 13 is inputted to the second input terminal of the OR gate 74 of the corresponding bit. Further, the comparator 71 and the comparator 72 perform the same operation as described in Embodiment 11.

After the level being shifted by the level shifter 17, the 8-bits enable pre signals ENBP_PRE<7:0> from the OR gate 74 are applied to the gate of P-channel MOS transistor P11 of each of the auxiliary voltage generating circuits 15 in the internal power voltage auxiliary supplying circuit 14.

Figure 20:
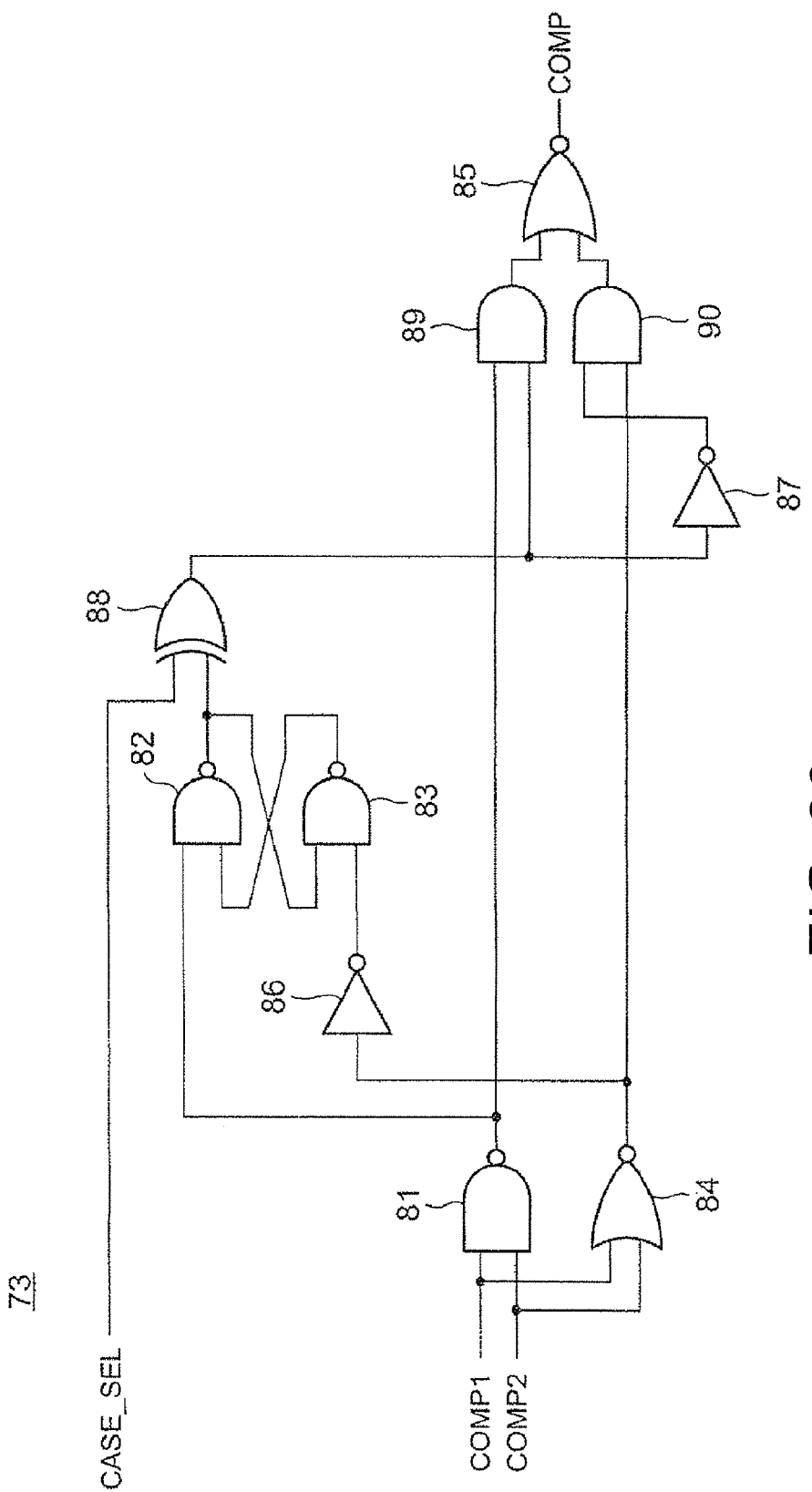
FIG. 20 is a circuit diagram illustrating a structure of the logic circuit 73 in FIG. 19.

FIG. 20 is a circuit diagram illustrating a structure of the logic circuit 73 in FIG. 19. In FIG. 20, the logic circuit 73 is constituted by including NAND gates 81 to 83, NOR gates 84 to 85, inverters 86 to 87, an XOR gate 88 and AND gates 89 to 90. After executing a logic process based on a predetermined case selecting signal CASE_SEL, the comparison result signal COMP1 and the comparison result signal COMP2, the logic circuit 73 outputs the comparison result signal COMP to the first input terminal of the OR gate 74. Herein, how the case selecting signal CASE_SEL switches between Cases is described as follows (for more details, referring to FIG. 22A and FIG. 22B). <Case 11> The comparison result signal COMP is set low based on the first reference voltage VDDREF1, and the comparison result signal COMP is set high based on the second reference voltage VDDREF2. <Case 12> The comparison result signal COMP is set low based on the second reference voltage VDDREF2, and the comparison result signal COMP is set high based on the first reference voltage VDDREF1.

Figure 21A:
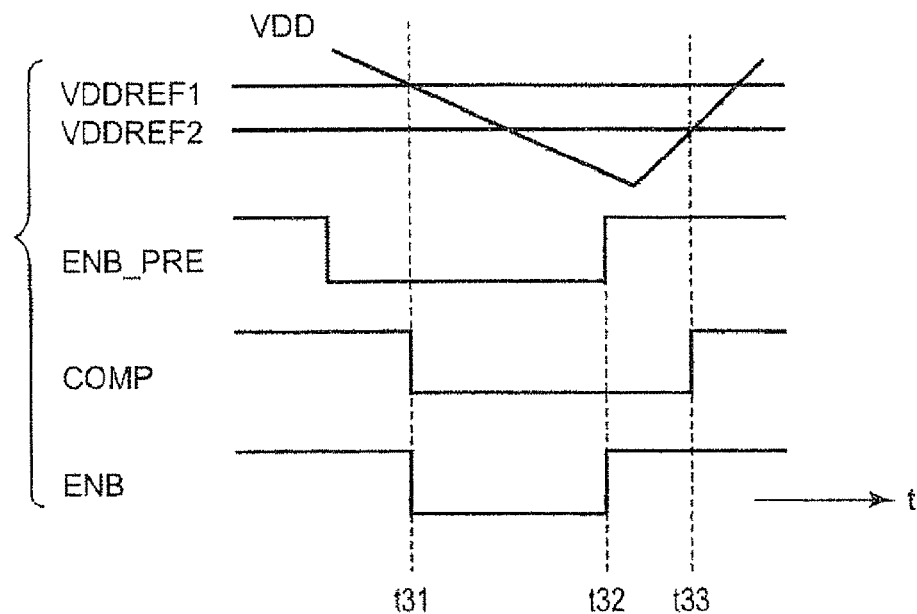
FIG. 21A illustrates a time sequence diagram of the overall circuit operation for Case 11 in FIG. 19.

FIG. 21A illustrates a time sequence diagram of the overall circuit operation for Case 11 in FIG. 19. In FIG. 21A, when the internal power voltage VDD is dropped below the first reference voltage VDDREF1 (at a time point t31), after the comparison result signal COMP and the enable signal ENB go to low, the enable pre signal ENB_PRE and the enable signal ENB are raised to high (at a time point t32); and when the internal power voltage VDD reaches above the second reference voltage VDDREF2 (at a time point t33), the comparison result signal COMP goes to high.

Figure 21B:
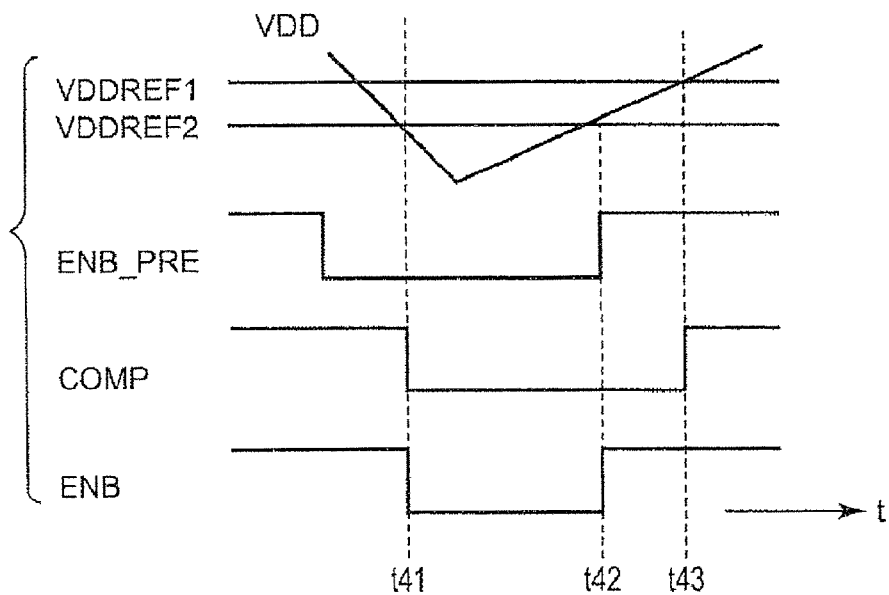
FIG. 21B illustrates a time sequence diagram of the overall circuit operation for Case 12 in FIG. 19.
Figure 22A:
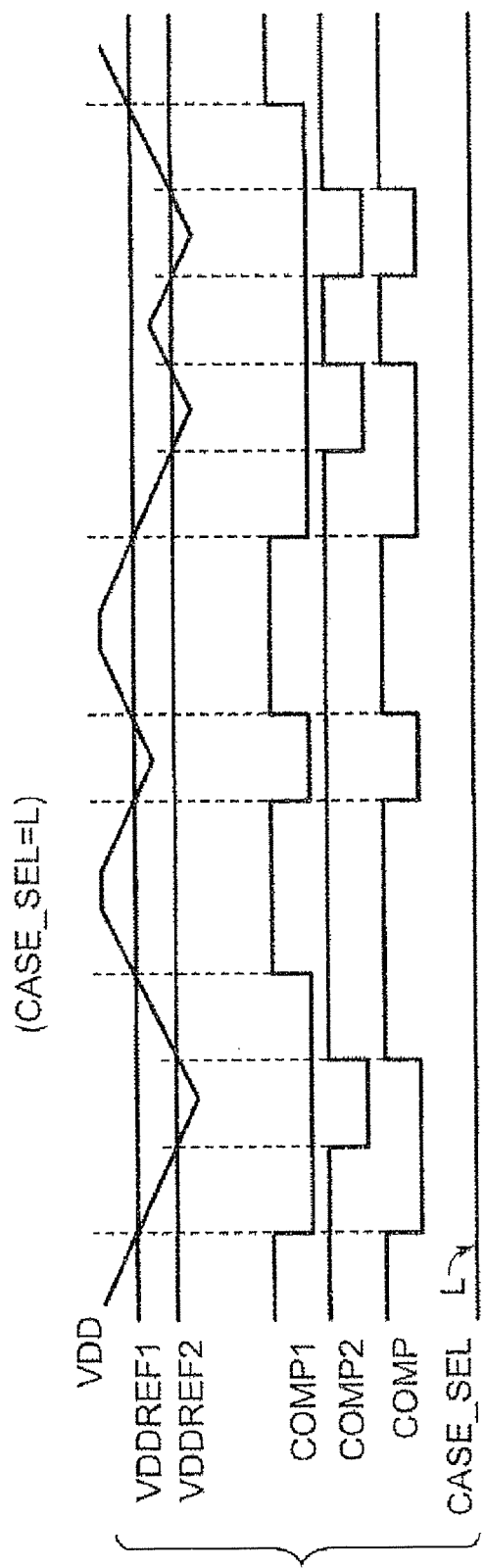
FIG. 22A illustrates a time sequence diagram of the detailed circuit operation for Case 11 in FIG. 19.
Figure 22B:
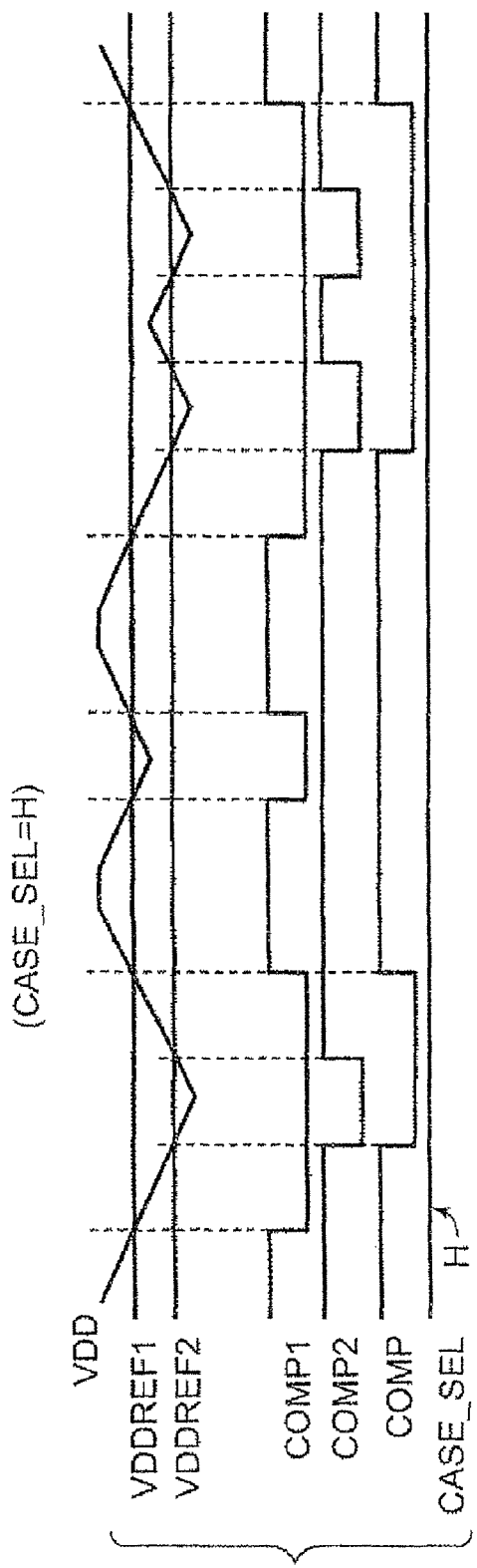
FIG. 22B illustrates a time sequence diagram of the detailed circuit operation for Case 12 in FIG. 19.

FIG. 22B illustrates a time sequence diagram of the overall circuit operation for Case 12 in FIG. 19. In FIG. 21B, when the internal power voltage VDD is dropped below the second reference voltage VDDREF2 (at a time point t41), after the comparison result signal COMP and the enable signal ENB go to low, the enable pre signal ENB_PRE and the enable signal ENB are raised to high (at a time point t42); and when the internal power voltage VDD reaches above the first reference voltage VDDREF1 (at a time point t43), the comparison result signal COMP goes to high.

FIG. 22A illustrates a time sequence diagram of the detailed circuit operation for Case 11 in FIG. 19. In view of FIG. 22A, it is clear that, the comparison result signal COMP is set low based on the first reference voltage VDDREF1, and the comparison result signal COMP is set high based on the second reference voltage VDDREF2.

FIG. 22B illustrates a time sequence diagram of the detailed circuit operation for Case 12 in FIG. 19. In view of FIG. 22B, it is clear that, the comparison result signal COMP is set low based on the second reference voltage VDDREF2, and the comparison result signal COMP is set high based on the first reference voltage VDDREF1.

As such, according to the present embodiment, besides the effectiveness in Embodiment 1, the enable signal ENB may also be generated according to the comparison result of the internal power voltage VDD and two reference voltages VDDREF having different levels. Therefore, as compared to Embodiment 1, the present embodiment allows the auxiliary voltage generating circuit 15 to operate more reliably.

In Embodiment 12, the case selecting signal CASE_SEL is used to selectively switch the operations of device by two Cases. However, the invention is not limited thereto, the case selecting signal CASE_SEL may also be fixed to any one level. That is to say, it is also possible that the case selecting signal CASE_SEL is not disposed.

Herein, generally, the reference voltage VDDREF1 inputted to the comparator 71 is, for example, set to be equal to the reference voltage VDDREF in Embodiment 1. However, the invention is not limited to the above, and the reference voltage VDDREF1 may also be set to be different from the reference voltage VDDREF in Embodiment 1 (e.g., it can be set to be higher than or lower than the reference voltage VDDREF in Embodiment 1).

Embodiment 13

Figure 23:
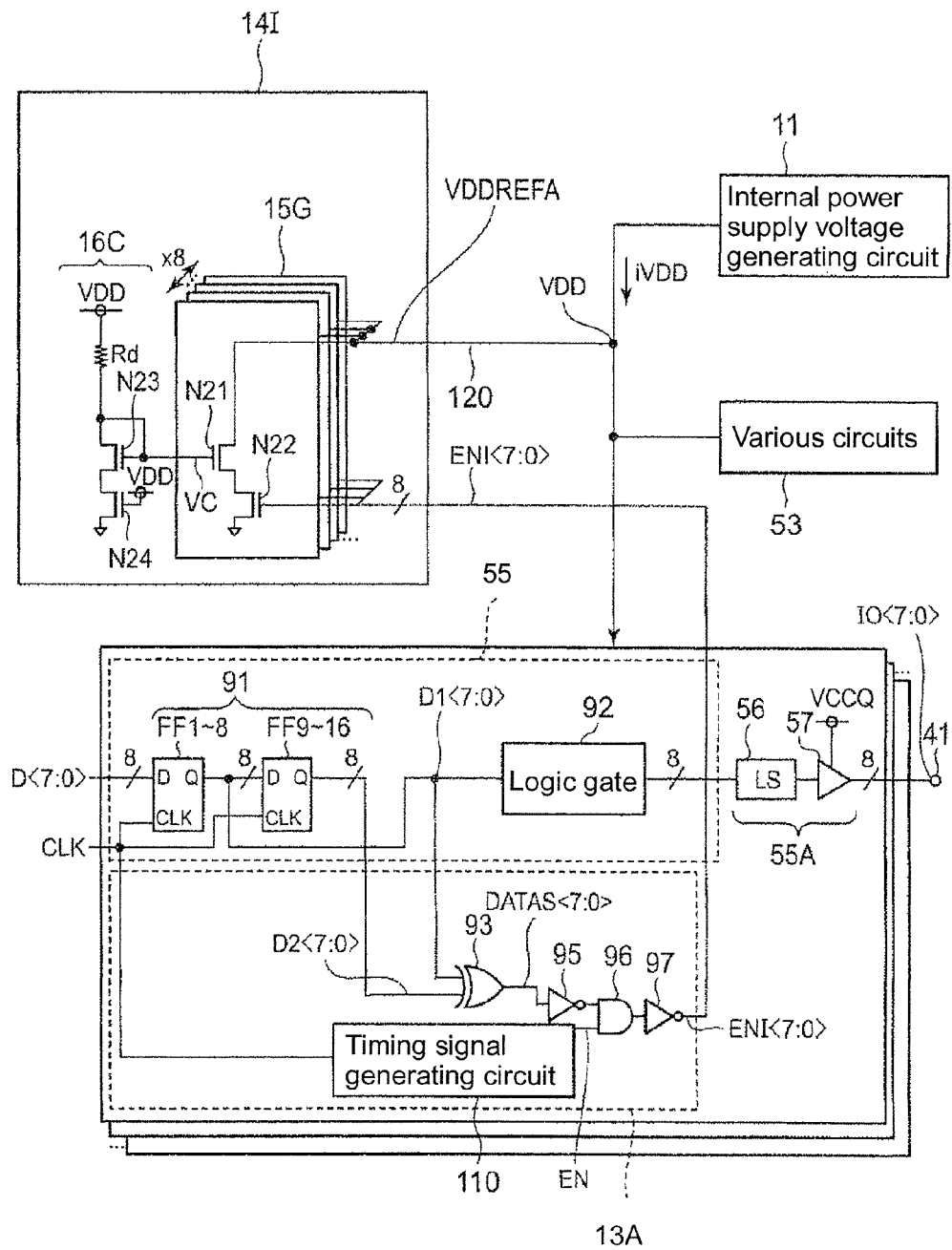
FIG. 23 is a circuit diagram illustrating a structure of the internal power voltage auxiliary consuming circuit 14I, the data output pipeline circuit 55, the output processing circuit 55A and a time sequence detecting circuit 13A according to Embodiment 13 of the invention.

FIG. 23 is a circuit diagram illustrating a structure of the internal power voltage auxiliary consuming circuit 14I, the data output pipeline circuit 55, the output processing circuit 55A and a time sequence detecting circuit 13A according to Embodiment 13 of the invention. As compared to the internal power voltage auxiliary consuming circuit 14 of Embodiment 1, the internal power voltage auxiliary consuming circuit 14I of Embodiment 13 is characterized in that, when a large load current flow to the various circuits (loading circuit) 53, by consuming the electrical charge of the load current, the load current may be maintained at a predetermined average current. Herein, as compared to Embodiment 1, the present embodiment has the following differences. (1) As a replacement of internal power voltage auxiliary supplying circuit 14, the internal power voltage auxiliary consuming circuit 14I having a control voltage generating circuit 16C and the auxiliary voltage consuming circuit 15G is provided. (2) The time sequence detecting circuit 13A is provided as a replacement of the time sequence detecting circuit 13.

In FIG. 23, the auxiliary voltage consuming circuit 15G is constituted by inserting a N-channel MOS transistor N21 and a N-channel MOS transistor N22 connected in series to each other between the internal power line 120 and a ground. The control voltage generating circuit 16C is constituted by inserting a resistor Rd and a N-channel MOS transistor N23 and a N-channel MOS transistor N24 connected in series to each other between the internal power voltage VDD and the ground. Further, a source of the N-channel MOS transistor N23 is connected to a drain of the N-channel MOS transistor N24. Based on the internal power voltage VDD, a current flow through the resistor Rd to the N-channel MOS transistor N23 and the N-channel MOS transistor N24. Accordingly, the drain of the N-channel MOS transistor N23 generates the control voltage VC. Herein, the N-channel MOS transistor N23 and the N-channel MOS transistor N21 constitute a current mirror circuit. Therefore, when the N-channel MOS transistor N22 may be turned on when enable signals ENI<7:0> (which will be described later) are at high level, it is controlled as a current corresponding to the current flowed in the N-channel MOS transistor N23 and N-channel MOS transistor N24 will flow in the N-channel MOS transistor N21 and the N-channel MOS transistor N22.

In FIG. 23, the data output pipeline circuit 55 is constituted by the same manner of FIG. 5.

The time sequence detecting circuit 13A is constituted by including the XOR gate 93, an inverter 95, an AND gate 96, an inverter 97 and the timing signal generating circuit 110. In the time sequence detecting circuit 13A in FIG. 23, the data signals D<7:0> inputted to the shift register 91 are shifted in sequence synchronously with the clock CLK while being temporarily stored, and the data signals D1<7:0> from the delay type flip-flops FF1 to FF8 are inputted to the first input terminal of the XOR gate 93. Further, the data signals D2<7:0> from the shift register 91 are inputted to the second input terminal of the XOR gate 93. The XOR gate 93 outputs the DATAS<7:0> as the operational result to a first input terminal of the AND gate 96 via the inverter 95. On the other hand, the timing signal generating circuit 110 generates the enable signal EN synchronously with the clock CLK to be outputted to a second input terminal of the AND gate 96. The AND gate 96 generates the enable pre signals ENI<7:0> by the inverter 97, with respect to the signal served as the operational result, and outputs the enable pre signals ENI<7:0> to the auxiliary voltage generating circuit 15.

In the internal power voltage auxiliary consuming circuit 14I constituted in aforesaid manner according to the present embodiment, the N-channel MOS transistor N22 may be turned on when the enable signals ENI<7:0> are at high level. In this case, it's controlled a current corresponding to the current flowed in the N-channel MOS transistor N23 and N-channel MOS transistor N24 to flow in the N-channel MOS transistor N21 and the N-channel MOS transistor N22. Herein, a drain voltage of the N-channel MOS transistor N21 is adjusted into a predetermined reference voltage VDDREFA. Generally, the reference voltage VDDREFA is set to be equal to the reference voltage VDDREF. However, the invention is not limited to the above, and the reference voltage VDDREFA may also be set to be different from the reference voltage VDDREF (e.g., it can be set to be higher than or lower than the reference voltage VDDREF).

Furthermore, it is clear that, in the control voltage generating circuit 16C, the circuits of 16, 16a, 16A, 16Ab and 16B as depicted in Embodiment 1 to Embodiment 12 may also be used. As such, the structures of time sequence detecting circuit or the internal power voltage auxiliary consuming circuit as depicted in Embodiment 9, Embodiment 10, Embodiment 11 and Embodiment 12 may also be used.

Accordingly, when a relatively large load current iVDD being overly large flow to the various circuits 53 (loading circuit), if the internal power supply voltage generating circuit fails to respond to the case when the large load current starts flowing or stops flowing, the internal power voltage VDD is prone to undershoot or overshoot. Therefore, when the load current is not over large while flowing, a part of the current may be auxiliarily consumed by the internal power voltage auxiliary consuming circuit 14I to average the load current iVDD into the predetermined average current, so as to stabilize the internal power voltage VDD.

Figure 24:
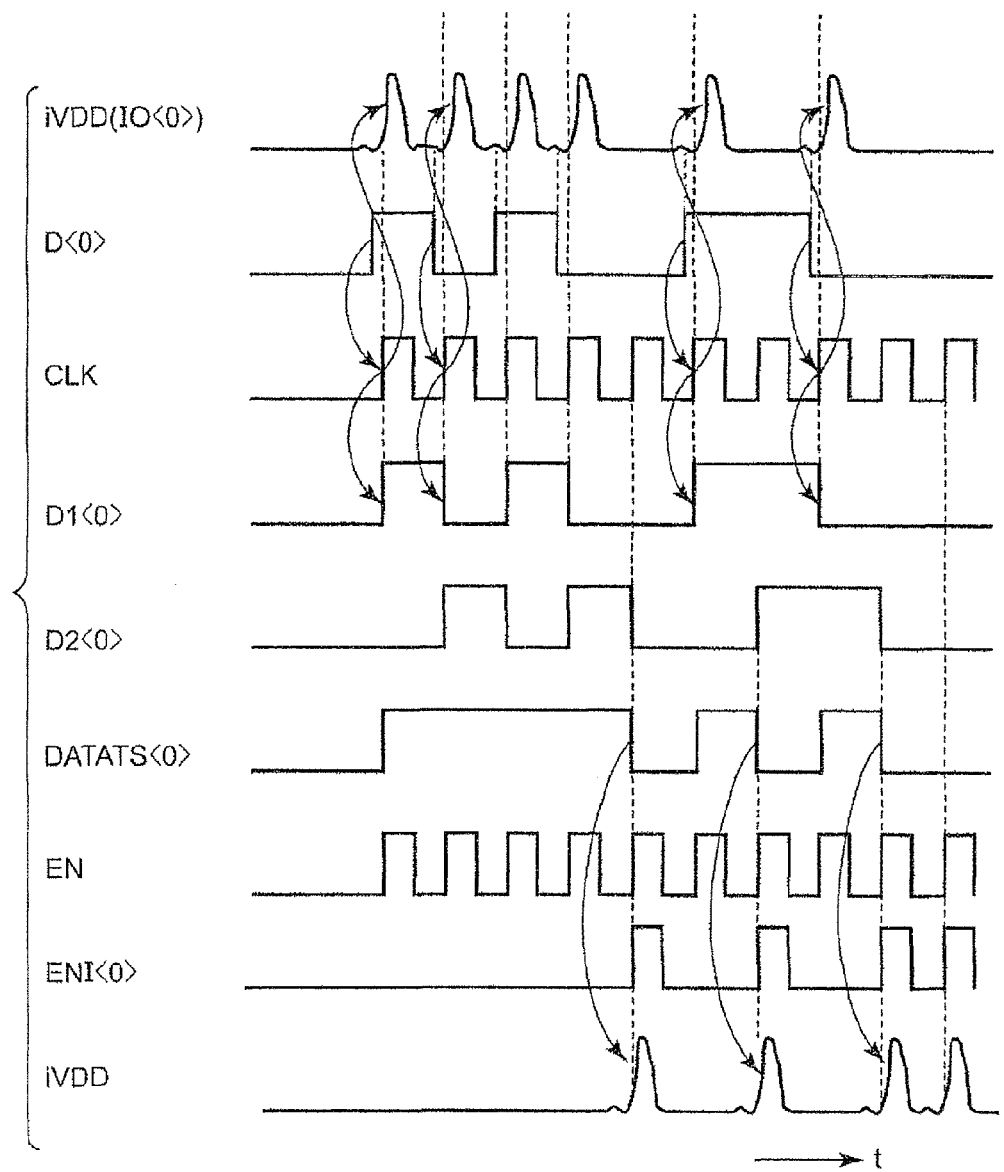
FIG. 24 illustrates a time sequence diagram of each signal in the circuit operation in FIG. 23.

FIG. 24 illustrates a time sequence diagram of each signal in the circuit operation in FIG. 23. As shown in FIG. 24, in the data signal DATAS, the enable signal ENI is synchronously generated in the case of low level (the load current becomes less as compared to the case of high level) so that the internal power voltage auxiliary consuming circuit 14I starts operating to make the current iVDD of the internal power voltage VDD flow, so as to consume the electronic charge of the internal power voltage VDD supplied to the internal power line 120 in order to average the load current iVDD into a predetermined average value. As a result, a stable voltage value of the internal power voltage VDD may be obtained.

Embodiment 14

Figure 25:
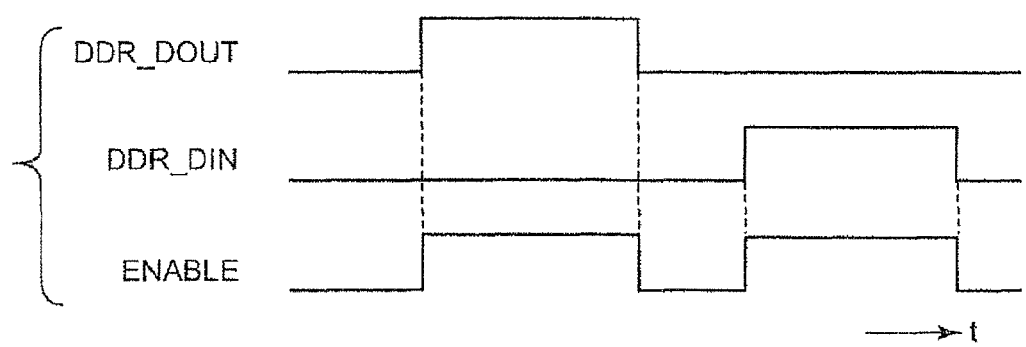
FIG. 25 illustrates a time sequence diagram of a suitable control operation in the internal power voltage auxiliary supplying circuits 14 to 14H, 14a, 14Aa, 14Ba or the internal power voltage auxiliary consuming circuit 14I, which are used for the DDR type flash memory according to Embodiment 13 of the invention.

FIG. 25 illustrates a time sequence diagram of a suitable control operation in the internal power voltage auxiliary supplying circuits 14 to 14H, 14a, 14Aa, 14Ba or the internal power voltage auxiliary consuming circuit 14I, which are used for the DDR type flash memory according to Embodiment 14 of the invention.

A controls signal ENABLE of FIG. 25 is, for example, a control signal generated by the time sequence detecting circuit 13 . . . etc in FIG. 1 and used for the DDR operation of the NAND type flash memory, and is synchronously generated together with a data writing signal DDR DIN and a data reading signal DDR OUT using the DDR. Further, a timing sequence of the operation is as shown by FIG. 25, in which operations of the internal power voltage auxiliary supplying circuits 14 to 14H, 14a, 14Aa, 14Ba or the internal power voltage auxiliary consuming circuit 14I may be started based on the control signal ENABLE or a control signal DDR_DOUT. Therefore, the circuits in Embodiment 1 to Embodiment 13 may be used in the DDR type flash memory.

Furthermore, in the data writing or reading performed by using the DDR, by using both of rising and falling the clock edge, the data may be transmitted in double speed (i.e., the double data rate) as compared to the single data rate (SDR) generally used by normal memory for transmitting data by using one edge of rising or falling of the clock. However, the invention is not limited thereto. The invention may also be used in a semiconductor memory device that transmits data with a speed faster than aforesaid speed.

Modification

In the foregoing embodiments, descriptions are provided with respect to the internal power supply voltage generating circuit used in the semiconductor non-volatile memory device such as the flash memory. However, the invention is not limited thereto. The invention is also suitable for various semiconductor memory devices such as semiconductor volatile memory device including the Dynamic Random Access Memory (DRAM), or Synchronous Dynamic Random Access Memory (SDRAM) and the like, as well as a semiconductor device such as a semiconductor integrated circuit including a processor and on the like. Also, the flash memory is not limited only to be the NAND type, and the invention is also suitable for a NOR type flash memory.

In the foregoing embodiments, basically, the internal power voltage VDD is lower than the external power voltage VCC. However, the invention is not limited thereto. It is also possible that the internal power voltage VDD is equal to the external power voltage VCC or the internal power voltage VDD is higher than the external power voltage VCC.

Further, the reference voltage VDDREF may be a predetermined rated voltage of the internal power voltage VDD, or may also be a voltage that is higher than said rated voltage or lower than said rated voltage.

Further, the reference voltage applied to each of the comparator 70 to the comparator 72, the reference voltages of the internal power voltage auxiliary supplying circuits and the reference voltages of the internal power voltage generating circuits may be the predetermined reference voltages identical to one another, or may be the predetermined reference voltages different from one another.

Therefore, the circuits for generating the enable signal in Embodiment 10 to Embodiment 12 may be used in Embodiment 1 to Embodiment 9.

Further, in the foregoing embodiments, despite most of the transistors of the auxiliary voltage generating circuits set to be the P-channel MOS transistors, as mentioned in Embodiment 2, Embodiment 3, and Embodiment 5 to Embodiment 7, the N-channel MOS transistors may also be used by adopting a logic inverted signal of the enable signal ENB.

INDUSTRIAL USABILITY

As described in detail above, the current for the internal power line may be auxiliary supplied by the internal power supply voltage auxiliary circuit according to the invention. Alternatively, the current may be averaged by consuming the current from the internal power line so as to stabilize the internal power voltage VDD. As a result, the data reading may be performed with the speed higher than that in the conventional technology without greatly increasing the power consumption even when being used in the semiconductor memory device that performs the data reading with the DDR.

What is claimed is:

1. An internal power supply voltage auxiliary circuit for an internal power supply voltage generating circuit, the internal power supply voltage generating circuit comprising a differential amplifier and a driving transistor, the differential amplifier comparing an internal power voltage supplied to a loading circuit with a predetermined first reference voltage and outputting a control signal indicating a comparison result from an output terminal, the driving transistor driving an external power voltage according to the control signal and outputting the internal power voltage to the loading circuit via an internal power line, the internal power supply voltage generating circuit adjusting the internal power voltage into the first reference voltage, and the internal power supply voltage auxiliary circuit comprising:
a time sequence detecting circuit, detecting a transition of a data signal, generating and outputting a detecting signal; and
an internal power voltage auxiliary supplying circuit, auxiliary supplying a current for the loading circuit based on the detecting signal.

2. The internal power supply voltage auxiliary circuit according to claim 1, wherein
the internal power voltage auxiliary supplying circuit comprises:
an auxiliary voltage generating circuit, comprising a first MOS transistor and a second MOS transistor connected in series between the external power voltage and the internal power line; and
a control voltage generating circuit, generating a control voltage for supplying a predetermined current to the internal power line,
the first MOS transistor is controlled according to the detecting signal, and
the second MOS transistor is controlled based on the control voltage to make the predetermined current flow.

3. The internal power supply voltage auxiliary circuit according to claim 2, wherein the auxiliary voltage generating circuit further comprises:
a charging capacitor, inserted between the first MOS transistor and the second MOS transistor, and charging an electrical charge of the current.

4. The internal power supply voltage auxiliary circuit according to claim 2, wherein
the control voltage generating circuit generates the control voltage according to a current corresponding to the predetermined current that flow based on the internal power voltage, and the current is flowing based on the external power voltage.

5. The internal power supply voltage auxiliary circuit according to claim 2, wherein
the control voltage generating circuit comprises:
a regulator control voltage generating circuit, making a current flow to a third MOS transistor and a resistor connected in series to each other between the external power voltage and a ground voltage to generate a control voltage as the control voltage for outputting, and the control voltage being applied to a gate of the third MOS transistor so that a voltage at a connection point between the third MOS transistor and the resistor becomes a predetermined second reference voltage.

6. The internal power supply voltage auxiliary circuit according to claim 5, wherein
the second reference voltage is identical to the first reference voltage.

7. The internal power supply voltage auxiliary circuit according to claim 5, wherein
the second reference voltage is lower than or higher than the first reference voltage.

8. The internal power supply voltage auxiliary circuit according to claim 2, wherein
the control voltage generating circuit generates and outputs the control voltage, wherein the control voltage being applied to a gate of the second MOS transistor so that the internal power voltage of the internal power line becomes a predetermined second reference voltage.

9. The internal power supply voltage auxiliary circuit according to claim 8, wherein
the second reference voltage is identical to the first reference voltage.

10. The internal power supply voltage auxiliary circuit according to claim 8, wherein
the second reference voltage is lower than or higher than the first reference voltage.

11. The internal power supply voltage auxiliary circuit according to claim 1, wherein
the internal power voltage auxiliary supplying circuit comprises:
an auxiliary voltage generating circuit, comprising a resistor and a MOS transistor connected in series between the external power voltage and the internal power line, and
the MOS transistor is controlled according to the detecting signal.

12. The internal power supply voltage auxiliary circuit according to claim 1, wherein
the internal power voltage auxiliary supplying circuit comprises:
an auxiliary voltage generating circuit, comprising a MOS transistor connected between the external power voltage and the internal power line, and
the MOS transistor is controlled according to the detecting signal.

13. The internal power supply voltage auxiliary circuit of claim 1, wherein
the time sequence detecting circuit detects transitions of multi-bit data signals, generates and outputs corresponding multi-bit detecting signals, and
the internal power voltage auxiliary supplying circuit comprises a plurality of auxiliary voltage generating circuits connected in parallel and having an amount identical to an amount of the multi-bit detecting signals.

14. The internal power supply voltage auxiliary circuit of claim 1, wherein
the time sequence detecting circuit detects transitions of multi-bit data signals, generates and outputs corresponding multi-bit detecting signals, and
the internal power supply voltage auxiliary circuit further comprises:
a data migration counting circuit, generating a detecting signal based on the multi-bit detecting signals, and outputting the migrated detecting signal to the internal power voltage auxiliary supplying circuit, and the migrated detecting signal having pulse width corresponding to a number of bits having a predetermined level in the multi-bit detecting signals.

15. The internal power supply voltage auxiliary circuit of claim 1, wherein
the time sequence detecting circuit detects transitions of multi-bit data signals, generates and outputs corresponding multi-bit detecting signals,
the internal power voltage auxiliary supplying circuit comprises a plurality of auxiliary voltage generating circuits connected in parallel and having an amount identical to an amount of the multi-bit detecting signals, and
the internal power supply voltage auxiliary circuit further comprises:
a comparison circuit, comparing the internal power voltage with a predetermined third reference voltage to generate a comparison result signal, and generating a plurality of different detecting signals based on the comparison result signal and the multi-bit detecting signals, and outputting the different detecting signals to the auxiliary voltage generating circuits.

16. The internal power supply voltage auxiliary circuit according to claim 15, wherein
the third reference voltage is identical to the first reference voltage.

17. The internal power supply voltage auxiliary circuit according to claim 15, wherein
the third reference voltage is lower than or higher than the first reference voltage.

18. The internal power supply voltage auxiliary circuit of claim 1, wherein
the time sequence detecting circuit detects transitions of multi-bit data signals, generates and outputs corresponding multi-bit detecting signals,
the internal power voltage auxiliary supplying circuit comprises a plurality of auxiliary voltage generating circuits connected in parallel and having an amount identical to an amount of the multi-bit detecting signals, and
the internal power supply voltage auxiliary circuit further comprises:
a comparison circuit, comparing the internal power voltage with a predetermined third reference voltage to generate a first comparison result signal, comparing the internal power voltage with a fourth reference voltage different from the third reference voltage to generate a second comparison result signal, and generating a plurality of different detecting signals based on the first comparison result signal, the second comparison result signal and the multi-bit detecting signals, and outputting the different detecting signals to the auxiliary voltage generating circuits.

19. The internal power supply voltage auxiliary circuit according to claim 18, wherein
the comparison circuit generates a plurality of different detecting signals based on the first comparison result signal, the second comparison result signal, the multi-bit detecting signals and a predetermined case selecting signal, and outputs the different detecting signals to the auxiliary voltage generating circuits, and
the comparison circuit selectively switches, according to the case selecting signal, to compare with the third reference voltage or compare with the fourth reference voltage by drop or rise of the internal power voltage.

20. The internal power supply voltage auxiliary circuit according to claim 18, wherein
the third reference voltage or the fourth reference voltage is identical to the first reference voltage.

21. The internal power supply voltage auxiliary circuit according to claim 18, wherein
the third reference voltage is lower than or higher than the first reference voltage.

22. The internal power supply voltage auxiliary circuit according to claim 1, wherein
the internal power supply voltage auxiliary circuit comprises:
a decoder, decoding a predetermined first multi-bit detecting signal into a decoded detecting signal having a number of bits less than a number of bits in the multi-bit detecting signal;
a plurality of auxiliary voltage generating circuits, each comprising a first MOS transistor and a second MOS transistor connected in series between the external power voltage and the internal power line; and
a plurality of control voltage generating circuits, making a current flow to a third MOS transistor and a resistor connected in series to each other between the external power voltage and a ground voltage in order to generate a control voltage applied to a gate of the third MOS transistor and generate the control voltage applied to a gate of the first MOS transistor corresponding to each of the auxiliary voltage generating circuits, and outputting the control voltages respectively so that a voltage at a connection point between the third MOS transistor and the resistor becomes a predetermined second reference voltage,
the second MOS transistor of each of the auxiliary voltage generating circuits is controlled according to a corresponding bit of the decoded detecting signal, and
the first MOS transistor of each of the auxiliary voltage generating circuits is controlled based on the control voltage from each of the control voltage generating circuits to make a predetermined current flow.

23. The internal power supply voltage auxiliary circuit according to claim 22, wherein
the auxiliary voltage generating circuit further comprises:
a charging capacitor, inserted between the first MOS transistor and the second MOS transistor, and charging an electronic charge of the current.

24. The internal power supply voltage auxiliary circuit according to claim 22, wherein the second reference voltage is identical to the first reference voltage.

25. The internal power supply voltage auxiliary circuit according to claim 22, wherein
the second reference voltage is lower than or higher than the first reference voltage.

26. The internal power supply voltage auxiliary circuit according to claim 22, wherein
the second reference voltages in the control voltage generating circuits are equal to or different from one another.

27. The internal power supply voltage auxiliary circuit of claim 22, wherein
resistance values of the resistors in the control voltage generating circuits are equal to or different from one another.

28. The internal power supply voltage auxiliary circuit of claim 11, wherein
the MOS transistor is a P-type MOS transistor or a N-type MOS transistor.

29. The internal power supply voltage auxiliary circuit according to claim 1, wherein
the time sequence detecting circuit detects transitions of multi-bit data signals, generates and outputs corresponding multi-bit detecting signals,
the internal power voltage auxiliary supplying circuit comprises an auxiliary voltage generating circuit, the auxiliary voltage generating circuit comprises a predetermined channel MOS transistor and a first N-channel MOS transistor connected in series between the external power voltage and the internal power line,
the internal power voltage auxiliary supplying circuit comprises a control voltage generating circuit, and the control voltage generating circuit makes the current flow to a second N-channel MOS transistor and a resistor connected in series to each other based on the external power voltage and outputs an output voltage of the second N-channel MOS transistor as the control voltage, wherein in the internal power voltage auxiliary supplying circuit,
the predetermined channel MOS transistor is controlled according to the multi-bit detecting signal, and the first N-channel MOS transistor is controlled based on the control voltage to make a predetermined current flow.

30. The internal power supply voltage auxiliary circuit according to claim 29, wherein
the predetermined channel MOS transistor is a P-type MOS transistor or a N-type MOS transistor.

31. The internal power supply voltage auxiliary circuit of claim 1, wherein
the internal power voltage is identical to the external power voltage.

32. The internal power supply voltage auxiliary circuit of claim 1, wherein
the internal power voltage is lower than or higher than the external power voltage.

33. A semiconductor memory device, comprising the internal power supply voltage auxiliary circuit of claim 1.

34. The semiconductor memory device of claim 33, wherein
the semiconductor memory device performs a data writing or a data reading with a speed faster than a clock speed based on a data wiring signal or a data reading signal respectively, and
the time sequence detecting circuit makes the internal power supply voltage auxiliary circuit to operate based on the data writing signal or the data reading signal.

35. The semiconductor memory device of claim 34, wherein
the speed faster than the clock speed is a double speed of the clock speed which is a double data rate (DDR).

36. A semiconductor device, comprising the internal power supply voltage auxiliary circuit of claim 1.

37. The internal power supply voltage auxiliary circuit of claim 2, wherein
the first MOS transistor and the second MOS transistor are P-type MOS transistors or N-type MOS transistors.

38. The internal power supply voltage auxiliary circuit of claim 12, wherein
the MOS transistor is a P-type MOS transistor or a N-type MOS transistor.

* * * * *